(12) United States Patent
Lin et al.

(10) Patent No.: US 12,394,485 B2
(45) Date of Patent: Aug. 19, 2025

(54) INTEGRATED CIRCUIT STRUCTURE AND METHOD FOR OPERATING THE SAME

(71) Applicant: MACRONIX INTERNATIONAL CO., LTD., Hsinchu (TW)

(72) Inventors: Yu-Yu Lin, New Taipei (TW); Feng-Min Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 142 days.

(21) Appl. No.: 18/519,156

(22) Filed: Nov. 27, 2023

(65) Prior Publication Data

US 2025/0174273 A1 May 29, 2025

(51) Int. Cl.
| | | |
|---|---|---|
| *G11C 16/16* | (2006.01) | |
| *G11C 5/06* | (2006.01) | |
| *G11C 16/04* | (2006.01) | |
| *G11C 16/08* | (2006.01) | |
| *G11C 16/14* | (2006.01) | |
| *H10B 41/10* | (2023.01) | |
| *H10B 41/27* | (2023.01) | |
| *H10B 41/35* | (2023.01) | |
| *H10B 43/10* | (2023.01) | |
| *H10B 43/27* | (2023.01) | |
| *H10B 43/35* | (2023.01) | |

(52) U.S. Cl.
CPC ......... *G11C 16/0483* (2013.01); *G11C 5/063* (2013.01); *G11C 16/08* (2013.01); *G11C 16/14* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC ...... G11C 16/16; G11C 16/14; G11C 16/3445
See application file for complete search history.

(56) References Cited

U.S. PATENT DOCUMENTS

| | | |
|---|---|---|
| 7,583,528 B2 | 9/2009 | Aoki |
| 9,601,194 B2 | 3/2017 | Nazarian |
| 2007/0121369 A1 | 5/2007 | Happ |
| 2011/0194357 A1* | 8/2011 | Han ............. G11C 16/16 365/185.29 |

FOREIGN PATENT DOCUMENTS

| | | |
|---|---|---|
| TW | 201535378 A | 9/2015 |
| WO | 2006095389 A1 | 9/2006 |

* cited by examiner

*Primary Examiner* — Jason Lappas
(74) *Attorney, Agent, or Firm* — McClure, Qualey & Rodack, LLP

(57) ABSTRACT

The integrated circuit structure includes a substrate and a first resistive memory string over the substrate. The first resistive memory string includes memory cells, and each of the memory cells includes a word line transistor and a resistor. The word line transistor includes a channel region, a gate over the channel region, and a plurality of source/drain regions on opposite sides of the channel region. The resistor is over the word line transistor and is connected with the word line transistor in parallel. The word line transistors of two adjacent memory cells share a same one of the source/drain regions, and the memory cells are connected in series using the sharing ones of the source/drain regions.

20 Claims, 18 Drawing Sheets

INTEGRATED CIRCUIT STRUCTURE AND METHOD FOR OPERATING THE SAME

BACKGROUND

Field of Invention

The present invention relates to an integrated circuit structure. More particularly, the present invention relates to a method for forming an integrated circuit structure and a method for operating an integrated circuit structure.

Description of Related Art

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

SUMMARY

The invention provides an integrated circuit structure (IC structure). The IC structure includes a substrate and a first resistive memory string over the substrate. The first resistive memory string includes memory cells, and each of the memory cells includes a word line transistor and a resistor. The word line transistor includes a channel region, a gate over the channel region, and a plurality of source/drain regions on opposite sides of the channel region. The resistor is over the word line transistor and is connected with the word line transistor in parallel. The word line transistors of two adjacent memory cells share a same one of the source/drain regions, and the memory cells are connected in series using the sharing ones of the source/drain regions.

In some embodiments, the each of the memory cells further includes a pair of contacts over the source/drain regions. The resistor is over a first one of the pair of contacts and free from coverage of a second one of the pair of contacts.

In some embodiments, the each of the memory cells further includes a metal line laterally extending from above the resistor across the gate to above the second one of the pair of contacts. The resistor is connected with the word line transistor in parallel using the pair of contacts and the metal line.

In some embodiments, from a top view, the metal lines of the memory cells are arranged in two rows with each of the metal lines being shifted relative to a next one of the metal lines along lengthwise directions of the gates.

In some embodiments, the IC structure further includes a string select transistor and a ground select line transistor. The string select transistor has a source/drain region electrically coupled to a first terminal one of the source/drain regions in the first resistive memory string. The ground select line transistor has a source/drain region electrically coupled to a second terminal one of the source/drain regions in the first resistive memory string. A gate of the string select transistor is electrically coupled to a gate of the ground select line transistor.

In some embodiments, the IC structure further includes a second resistive memory string and an assist transistor. The assist transistor is electrically coupled a first terminal one of source/drain regions in the second resistive memory string to the second terminal one of the source/drain regions in the first resistive memory string.

The invention provides an integrated circuit structure (IC structure). The IC structure incudes a substrate having a diffusion region thereon and a resistive memory string. The resistive memory string includes first and second sub-strings, a first metal line, and a third metal contact. The first sub-string includes first and second gates extending over the diffusion region, and a first metal contact over the diffusion region and between the first and second gates. The second sub-string includes third and fourth gates extending over the diffusion region, and a second metal contact over the diffusion region and between the third and fourth gates. The first metal line laterally extends from above the first metal contact of the first sub-string across the second and third gates to above the second metal contact of the second sub-string. The third metal contact is over the diffusion region and between the second and third gates. The third metal contact is configured to applied with an operation voltage.

In some embodiments, the first and second metal contacts define a metal contact-free region therebetween underlying the first metal line.

In some embodiments, the second sub-string further includes fourth and fifth metal contacts, a first resistor, and a second metal line. The fourth and fifth metal contacts are over the diffusion region and at opposite sides of the fourth gate. The first resistor is over the fourth metal contact. The second metal line laterally extends from above the first resistor across the fourth gate to above the fifth metal contact.

In some embodiments, the first and second metal contacts are arranged at a first row, and the third, fourth, and fifth metal contacts are arranged at a second row.

In some embodiments, the first sub-string further includes sixth and seventh metal contacts, a second resistor, and a third metal line. The sixth and seventh metal contacts are over the diffusion region and at opposite sides of the first gate. The second resistor is over the sixth metal contact. The third metal line laterally extends from above the second resistor across the first gate to above the seventh metal contact.

In some embodiments, the first and second metal contacts are arranged at a first row, and the third, fourth, fifth, sixth, and seventh metal contacts are arranged at a second row.

In some embodiments, the IC structure further includes a resistor vertically between the first metal contact and the first metal line.

The invention provides a method for operating an integrated circuit structure (IC structure). The IC structure includes a resistive memory string over a substrate. The resistive memory string has a plurality of sub-strings connected in series. Each of the sub-strings includes a plurality of word line transistors and a pair of terminal transistors connected in series, thereby forming a pickup terminal between two of the terminal transistors respectively in adjacent two of the sub-strings. The each of the sub-strings further includes a plurality of resistors, each connected in parallel with a respective one of the word line transistors. The method includes alternating applying a first operation voltage and a second operation voltage on the pickup terminals of the resistive memory string; performing a program operation on the resistive memory string; performing an erase operation on the resistive memory string.

In some embodiments, the first operation voltage is a programming voltage, and the second operation voltage is a ground voltage.

In some embodiments, the step of performing the program operation or the step of performing the erase operation includes activating the pair of terminal transistors of one of the sub-strings, the one of the sub-strings acting as a selected cell group. The step of activating allows for forming a voltage difference between the pair of terminal transistors in the one of the sub-strings, facilitating a current flowing through the one of the sub-strings.

In some embodiments, the method further includes deactivating one of the word line transistors in the one of the sub-strings, allowing for the current flowing through the resistor connected in parallel with the deactivated one of the word line transistors.

In some embodiments, the method further includes activating one of the word line transistors in the one of the sub-strings, allowing for the current flowing through the activated one of the word line transistors but bypassing the resistor connected in parallel with the activated one of the word line transistors.

In some embodiments, the step of performing the program operation or the step of performing the erase operation includes activating a first one of the pair of terminal transistors in one of the sub-strings; deactivating a second one of the pair of terminal transistors in the one of the sub-strings, the one of the sub-strings acting as an operation voltage inhibition region. The step of activating accompanying the step of deactivating allows for a consistent voltage between the pair of terminal transistors in the one of the sub-strings, eliminating an operation disturbance in the one of the sub-strings.

In some embodiments, the method further comprises activating the word line transistors in the one of the sub-strings.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
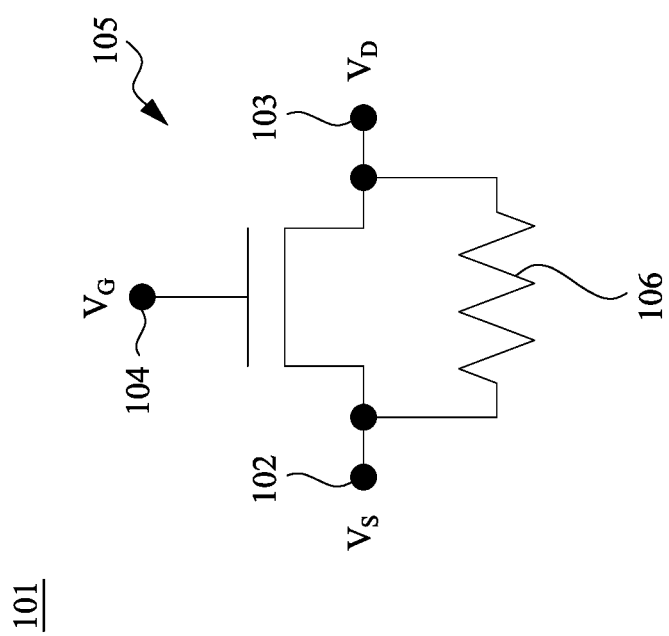
FIG. 1A is a schematic diagram of a memory cell in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Resistive memory devices, known as ReRAMs, offer diverse array configurations, including the NOR-like and NAND-like setups. The NAND-type ReRAM string can be used in the mixed-mode matrix-vector multiplication (MVM) architecture. Within this architecture, each weight unit cell can be designed with a resistive memory cell in parallel with a transistor. These memory cells can vary in type, from ReRAMs to PCMs (phase change memories).

When combined, they can form a serially connected NAND-type resistive memory string. However, this architecture faces challenges during specific operations like reading or programming/erasing. For instance, accessing a selected memory cell requires turning off its associated transistor, while transistors in unselected cells stay active. This design choice, combined with the serial connection of multiple resistive memory cells, can lead to increased series resistance, which can effect the efficiency of the selected memory cell.

Therefore, the present disclosure in various embodiments provides a layout to improve the long NAND-type resistive memory string, such that the series (or loading) resistance associated with the selected memory cell can be decreased. An additional pickup connection to the long NAND-type resistive memory string is introduced. The additional pickup connection can divide the lengthy resistance string (R-string) into shorter. Furthermore, an inhibit scheme on the non-selected memory cells can be applied on the resistive memory string, ensuring the non-selected memory cells remain undisturbed during operations.

Figure 1B:
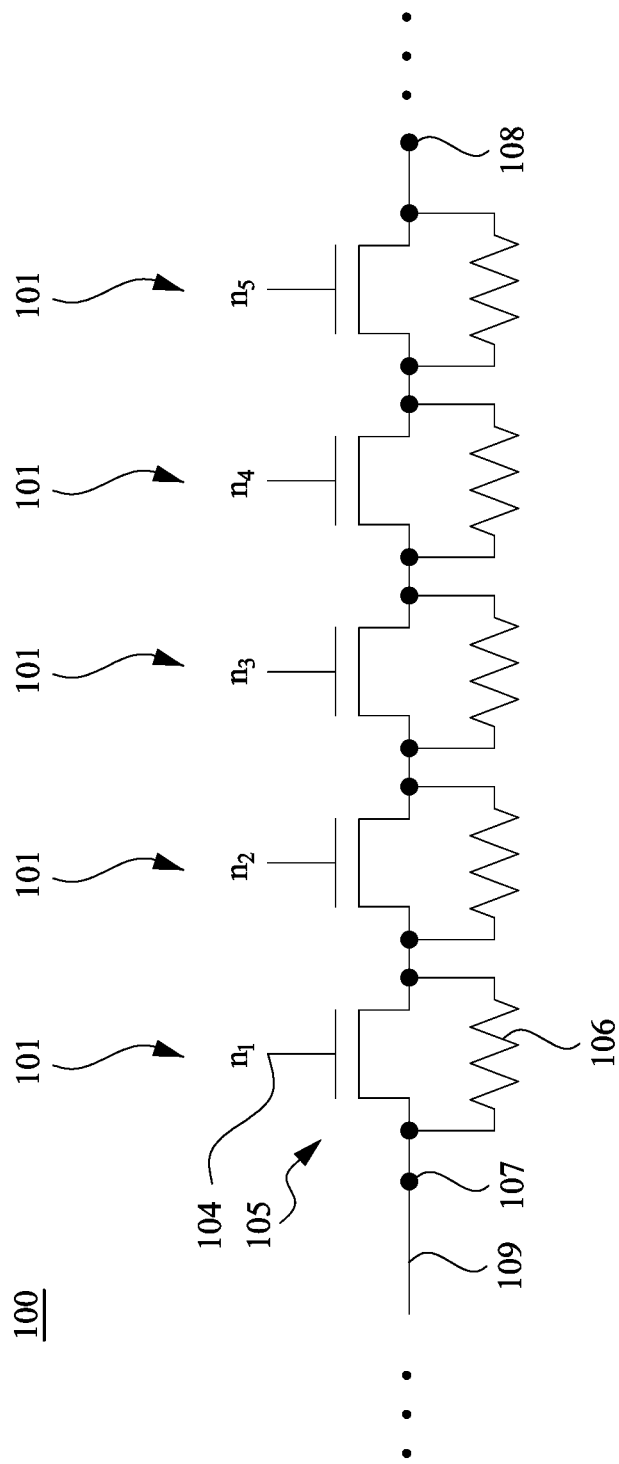
FIG. 1B illustrates a schematic circuit diagram of a resistive memory string including a plurality of memory cells in accordance with some embodiments of the present disclosure.
Figure 1C:
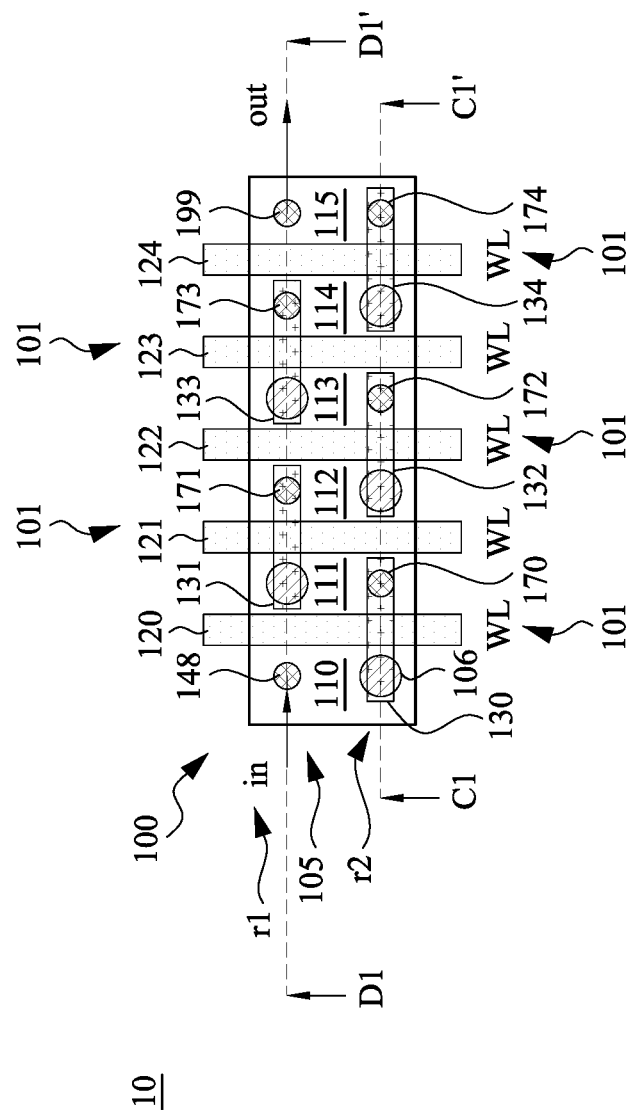
FIG. 1C illustrates a schematic top view of a semiconductor structure including a resistive memory string in accordance with some embodiments of the present disclosure.
Figure 1D:
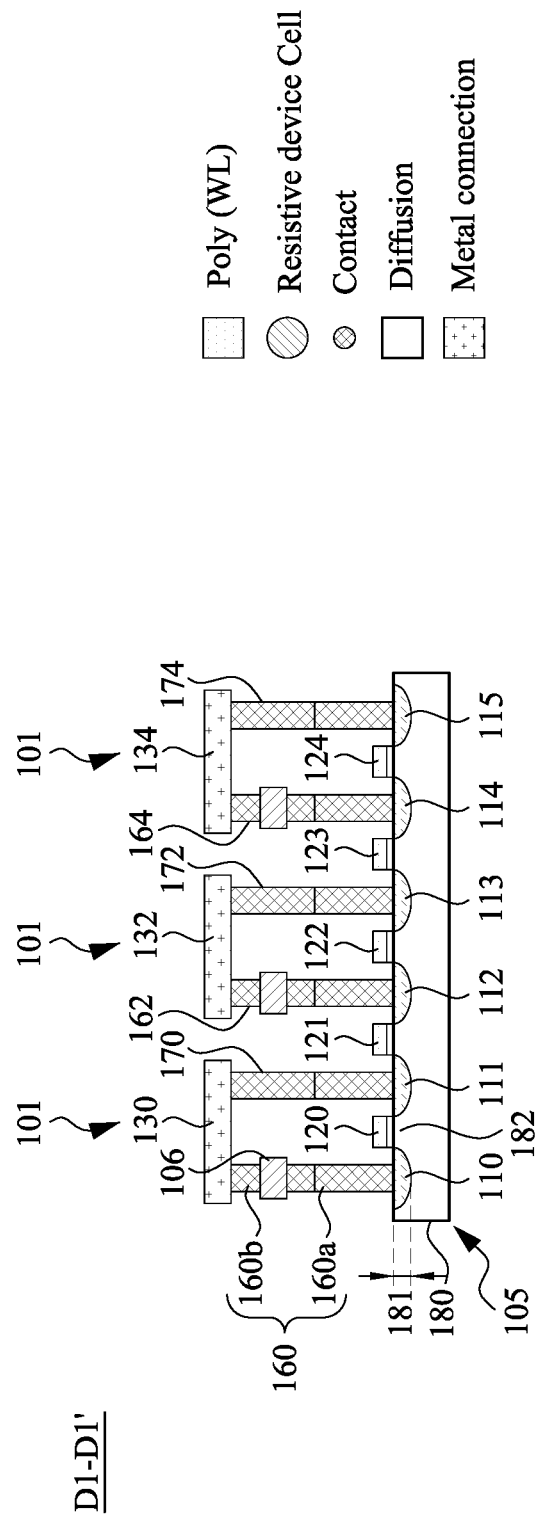
FIGS. 1D and 1E illustrate schematic cross-sectional views obtained from reference cross-sections D1-D1' and E1-E1' in FIG. 1C.
Figure 1E:
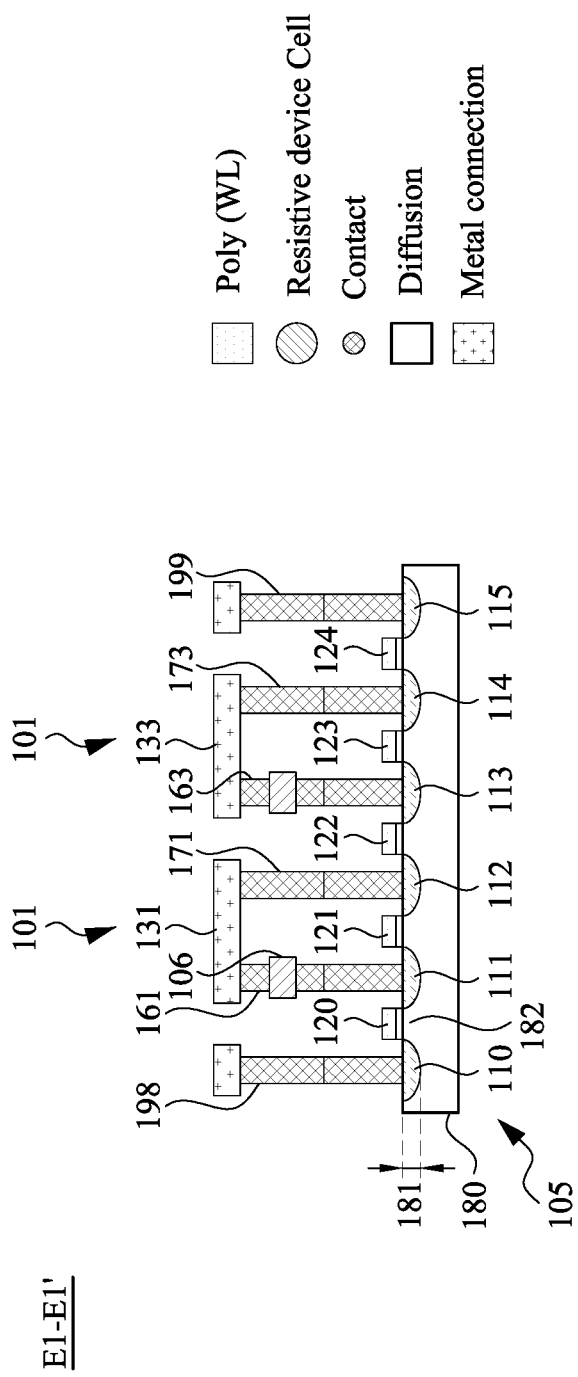

Reference is made to FIGS. 1A-1E. FIG. 1A is a schematic diagram of a memory cell 101 in accordance with some embodiments of the present disclosure. FIG. 1B illustrates a schematic circuit diagram of a resistive memory string 100 including a plurality of memory cells 101 in accordance with some embodiments of the present disclosure. In some embodiments, the resistive memory string 100 can be an NAND-type resistive memory string. FIG. 1C illustrates a schematic top view of a semiconductor structure 10 including the resistive memory string 100 in accordance with some embodiments of the present disclosure. FIGS. 1D and 1E illustrate schematic cross-sectional views obtained from reference cross-sections D1-D1' and E1-E1' in FIG. 1C.

As shown in FIG. 1A, the memory cell 101 can include a current-carrying node 102, a current-carrying node 103, a control terminal 104, a transistor 105, and a programmable resistor 106. In some embodiments, the memory cell 101 can be a variable resistance cell, and the programmable resistor 106 can be interchangeably referred to as a resistive memory cell. A voltage Vs on the first current-carrying node 102 can be characterized as a source voltage for the memory cell 101, and a voltage VD on the second current-carrying node 103 can be characterized as a drain voltage for the memory cell 101. The transistor 105 and the programmable resistor 106 are connected in parallel to the current-carrying nodes 102 and 103. The transistor 105 has a gate connected to the control terminal 104. The control terminal 104 can correspond to a word line (e.g., word lines 120-124 as shown FIG. 1C) in a memory array. A voltage VG on the control terminal 104 can be characterized as a gate voltage for the transistor 105.

In some embodiments, a cell current can be applied to the current-carrying node 103, having a current amplitude that is set in design, or adjustable, to establish a voltage drop in the memory cell 101, depending on the voltage range of the voltage sense amplifier, and the resistance values in the memory cells for the programmable resistor 106. The current amplitude can be tuned according to a particular embodiment of the memory array, so that a usable range of voltages can be generated on the resistive memory string 100 (see FIG. 1B) for supply to the summing node. Also, the range of programmable resistances of the programmable resistor 106 and the configuration of the programmable threshold of the transistor 105 can be designed to operate with the selected current level and a specified sensing range.

In some embodiments, the transistor 105 can be implemented using a MOS transistor, having an n-channel or a p-channel, configured to operate as a switch that provides a low resistance path when on, effectively bypassing the programmable resistor 106, so that that the voltage drop across the memory cell 101 can be small; and that provides a high resistance path when off, effectively blocking current through the switch, so that the voltage drop across the memory cell 101 is a function primarily of the resistance of the programmable resistance and the current through the memory cell 101.

As shown in FIG. 1B, the resistive memory string 100 may include a plurality of memory cells 101 where each of the memory cells 101 can include the transistor 105 and the programmable resistor 106 electrically connected in parallel. In the resistive memory string 100, a current direction plays a role in manipulating the resistance of specific programmable resistors 106. To achieve this, each memory cell 101 in the resistive memory string 100 is equipped with a parallel transistor 105. When the aim is to program the resistance of the programmable resistor 106 in the target memory cell 101, the associated parallel transistor 105 in that target cell is turned off. This action isolates the programmable resistors 106, ensuring that the programming current flows directly through it. Concurrently, to ensure the rest of the memory string 100 remains operational and the current doesn't mistakenly alter other programmable resistors 106, the parallel transistors 105 in all other memory cells 101 within the resistive memory string 100 are kept turned on. This regulation can allow precise control over individual programmable resistors 106 in the memory string 100, ensuring accurate data storage and retrieval.

By way of example and not limitation, the resistive memory string 100 may include five memory cells 101 in series between a summing node 107 and a reference line (e.g., a ground line 108). Other embodiments may contain more or fewer number of memory cells 101. The summing node 107 is coupled to a voltage sensing sense amplifier to generate a signal representing the sum-of-products output of resistive memory string 100. A current source 109 is coupled to the resistive memory string 100 to apply a constant current during the sensing operation. In some embodiments, five word lines can be coupled to the control terminals 104 of the memory cells 101 in each of the resistive memory strings 100 in the memory array. In some embodiments, a voltage applied to the control terminals 104 (or word lines) correspond to the variable inputs n1, n2, n3, n4, and n5. In some embodiments, the transistor 105 can be interchangeably referred to as a word line transistor.

In some embodiments, the memory cells 101 have weights set as a function of the current in the resistive memory string 100, the threshold voltage (Vt) of the transistor 105 in the memory cell 101, and the programmed resistance of the resistor 106. The variable resistance of each of the memory cells 101 in the resistive memory string 100 is a function of the current in the resistive memory string 100, the threshold voltage (Vt) of the transistor 105 in the memory cell 101, a voltage applied on the word line to the gate of the memory cell 101, and the programmed resistance of the resistor 106.

As shown in FIG. 1C, the resistive memory string 100 can include a sequence of source/drain regions 110-115, which act as source/drain terminals of a sequence of the five transistors 105 in this illustration. The gates of the five transistors 105 can be provided on word lines 120-124. Parallel resistors 106 are implemented in each of the memory cells 101 using a current path that bridges the transistor 105. Contacts 198, 199 can connect to overlying conductors (not shown), which can connect to other metal connections of a memory string, or to peripheral circuitry supporting the sum-of-products configuration. In some embodiments, the contacts 198 and 199 can be interchangeably referred to as pickup connections.

Specifically, the memory cells 101 can be constructed after a contact formation process, and a subsequent metal routing process can be performed to connect two of the memory cells 101 with each other. Every source/drain region (e.g., source/drain regions 111-114) in the resistive memory string 100 can be interconnected with two adjacent source/drain regions, excluding the source/drain region at the ending terminal ones (e.g., source/drain regions 110 and 115) of the resistive memory string 100. Each conductive terminal has dual contacts (e.g., two of the contacts 170-175 and the contacts 160-164 (see FIGS. 1D and 1E)) to facilitate these interconnections with neighboring source/drain regions. The metal routing (e.g., metal connections 130-134) can connect the memory cell 101 using one of the contacts (either from the contacts 160-164 or 170-174) to another one of the contacts on the neighboring conductive terminal, thereby constructing the resistive memory string 100.

With the configuration of the memory cells 101 containing parallel resistors 106 bridging the transistors 105, and the source/drain regions 110-115 acting as source/drain terminals, the design can be compact. This layout can allow for higher memory density, which means more data can be stored in a smaller area. The design offers a versatile method of interconnecting the memory cells 101. Every source/drain region (e.g., the source/drain regions 111-114) connects to two neighboring terminals, except at the ending terminal ones (e.g., the source/drain regions 110 and 115). This flexibility can improve data flow, potentially speeding up read/write operations.

Specifically, in a first one of the memory cells 101 formed over the source/drain regions 110 and 111, a contact 160 (see FIG. 1D) including the programmable resistor 106 can be formed to be in electrical contact with the source/drain region 110, a contact 170 can be formed to be in electrical contact with the source/drain region 111, and a metal connection 130 can be formed to laterally extend from above the programmable resistor 106 across the word line 120 to above the contact 170. That is, the pair of contacts 160 and 170 is formed over the source/drain regions 110 and 111, wherein the programmable resistor 106 is over the contact 160 and free from coverage of the contact 170.

In a second one of the memory cells 101 formed over the source/drain regions 111 and 112, a contact 161 (see FIG. 1E) including the programmable resistor 106 can be formed to be in electrical contact with the source/drain region 111, a contact 171 can be formed to be in electrical contact with the source/drain region 112, and a metal connection 131 can be formed to laterally extend from above the programmable resistor 106 across the word line 121 to above the contact 171. In other words, the pair of contacts 161 and 171 is formed over the source/drain regions 111 and 112, wherein the programmable resistor 106 is over the contact 161 and free from coverage of the contact 171.

In a third one of the memory cells 101 formed over the source/drain regions 112 and 113, a contact 162 (see FIG. 1D) including the programmable resistor 106 can be formed to be in electrical contact with the source/drain region 112, a contact 172 can be formed to be in electrical contact with the source/drain region 113, and a metal connection 132 can be formed to laterally extend from above the programmable resistor 106 across the word line 122 to above the contact 172. In other words, the pair of contacts 162 and 172 is formed over the source/drain regions 112 and 113, wherein the programmable resistor 106 is over the contact 162 and free from coverage of the contact 172.

In a fourth one of the memory cells 101 formed over the source/drain regions 113 and 114, a contact 163 (see FIG. 1E) including the programmable resistor 106 can be formed to be in electrical contact with the source/drain region 113, a contact 173 can be formed to be in electrical contact with the source/drain region 114, and a metal connection 133 can be formed to laterally extend from above the programmable resistor 106 across the word line 123 to above the contact 173. In other words, the pair of contacts 163 and 173 is formed over the source/drain regions 113 and 114, wherein the programmable resistor 106 is over the contact 163 and free from coverage of the contact 173.

In a fifth one of the memory cells 101 formed over the source/drain regions 114 and 115, a contact 164 (see FIG. 1D) including the programmable resistor 106 can be formed to be in electrical contact with the source/drain region 114, a contact 174 can be formed to be in electrical contact with the source/drain region 115, and a metal connection 134 can be formed to laterally extend from above the programmable resistor 106 across the word line 124 to above the contact 174. In other words, the pair of contacts 164 and 174 is formed over the source/drain regions 114 and 115, wherein the programmable resistor 106 is over the contact 164 and free from coverage of the contact 174.

The metal connections 130-134 can be arranged in two rows r1 and r2 with each of the metal connection 130-134 being shifted relative to a next one of the metal connection 130-134 along lengthwise directions of the word lines 120-124 from the top view, optimizing space utilization and ensuring a clear path for currents. This setup can minimize interference and cross-talk between adjacent paths, ensuring clearer and more accurate data transfer. Specifically, the metal connections 131 and 133 can be arranged in the row r1, and the metal connections 130, 132, and 134 can be arranged in the row r2 in parallel with the row r1. Similarly, the programmable resistors 106 can be arranged in the two rows r1 and r2 with each of the programmable resistors 106 being shifted relative to a next one of the programmable resistors 106 along the lengthwise directions of the word lines 120-124.

Therefore, the resistive memory string 100 can offer a compact, flexible, and reliable layout for memory storage, with an architecture optimized for efficient data flow, manufacturing consistency, and easy integration into broader semiconductor systems.

As shown in FIGS. 1D and 1E, a diffusion region 181 can be formed over a substrate 180. The substrate 180 can be a semiconductor substrate, such as a monocrystalline silicon bulk semiconductor, a semiconductor-on-insulator (SOI) substrate, or the like, which may be doped (e.g., with a p-type or an n-type impurity) or undoped. The SOI substrate can a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 180 may be a carrier wafer, such as a lower cost wafer or a reclaim wafer. In some embodiments, the substrate 180 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; the like; or combinations thereof.

The word lines 120-124 formed over the diffusion region 181. In some embodiments, the word lines 120-124 may be made of tungsten (W), cobalt (Co), ruthenium (Ru), molybdenum (Mo), aluminum (Al), copper (Cu), combinations thereof, or other suitable materials. In some embodiments, the word lines 120-124 can be interchangeably referred to as gates, poly gates, metal gates, gate structures, gate strips, gate lines, gate layers, or gate patterns.

The source/drain regions 110-115 formed at opposite sides of the word lines 120-124, and can be formed by implanting n-type dopants ($N^+$) (e.g., phosphorus or arsenic) or p-type dopants ($P^+$) in a diffusion region 181 (or an active region) of a substrate 180, such that the source/drain regions 110-115 can be $N^+$ poly-silicon layers or $P^+$ poly-silicon layers. In some embodiments, the source/drain regions 110-115 can be interchangeably referred to as current conducting terminals, source/drain patterns, or doped semiconductive layers. Channel regions 182 are formed underlying the word lines 120-124. Each of the transistors 105 may include the channel region 182, a corresponding one of the word lines 120-124, and a corresponding pair of the source/drain regions 110-115. The transistors 105 in two adjacent memory cells 101 share a same one of the source/drain regions 110-115, and the memory cells 101 are connected in series using the sharing ones of the source/drain regions 110-115.

The programmable resistors 106 are formed to dispose in the contacts 160-164 and spaced away from the metal connections 130-134 by a vertical distance. In some embodiments, the programmable resistors 106 may include transition metal oxide layers, for example, which can be programmed to variable resistance values using programming pulses and verify operations as is for resistive RAM implementations. By way of example and not limitation, the programmable resistors can include two-terminal devices having first and second electrodes, with a metal oxide in between that can be programmed to multiple resistance values. In such embodiments, the metal-oxide layer may include one or more metal oxides from the group of tungsten oxide, titanium oxide, nickel oxide, aluminum oxide, copper oxide, zirconium oxide, niobium oxide, tantalum oxide, titanium nickel oxide, Cr-doped $SrZrO_3$, Cr-doped $SrTiO_3$, PCMO and LaCaMnO. In some embodiments, the programmable resistive element between the electrodes may comprise WO/Cu or Ag, TiO/Cu or Ag, NiO/Cu or Ag, AlO/Cu or Ag, CuO/Cu or Ag, ZrO/Cu or Ag, NbO/Cu or Ag, TaO/Cu or Ag, TiNO/Cu or Ag, Cr-doped $SrZrO_3$/Cu or Ag, Cr-doped $SrTiO_3$/Cu or Ag, PCMO/CU or Ag, LaCaMnO/Cu or Ag, and $SiO_2$/Cu or Ag.

In some embodiments, the programmable resistors 106 can comprise phase change memory elements. Embodiments of the phase change materials include phase change based memory materials, including chalcogenide based materials and other materials. Chalcogens include any of the four elements oxygen (O), sulfur(S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. In other examples, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties.

Chalcogenides and other phase change materials are doped with impurities, in some embodiments, to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide.

Other programmable resistance structures, as alternative to those based on phase change cells and metal oxide cells described above, include solid state electrolyte (conductive bridge) memory cells and magnetoresistive memory cells, spin transfer torque material, and magnetic material, and can be applicable to the present disclosure.

In some embodiments, the contacts 160-164 each has two portions (or segments, e.g., lower portion and upper portion) sandwiching the programmable resistors 106. Specifically, the contact 160 (see FIG. 1D) can have a lower portion 160*a* and an upper portion 160*b*, the lower portion 160*a* is situated between the source/drain region 110 and the programmable resistors 106, and the upper portion 160*b* is situated between the programmable resistors 106 and the metal connection 130. In some embodiments, the contacts 160-164, 170-175, 198, and 199 may be made of tungsten (W), cobalt (Co), ruthenium (Ru), molybdenum (Mo), aluminum (Al), copper (Cu), combinations thereof, or other suitable materials. In some embodiments, the contacts 160-164, 170-175, 198, and 199 can be interchangeably referred to as metal contacts, metal plugs, conductive contact, metal vias, or inter-layer connectors.

In some embodiments, the metal connections 130-134 may be made of tungsten (W), cobalt (Co), ruthenium (Ru), molybdenum (Mo), aluminum (Al), copper (Cu), combinations thereof, or other suitable materials. In some embodiments, the metal connections 130-134 can be interchangeably referred to as metal lines, metal segments, metal strips, metal patterns, meal bridge elements, or metal routings. In some embodiments, the metal connections 130-134 may be made of a different material than the contacts 160-164, 170-175, 198, and 199. In some embodiments, the metal connections 130-134 may be made of a same material as the contacts 160-164, 170-175, 198, and 199.

Figure 1F:
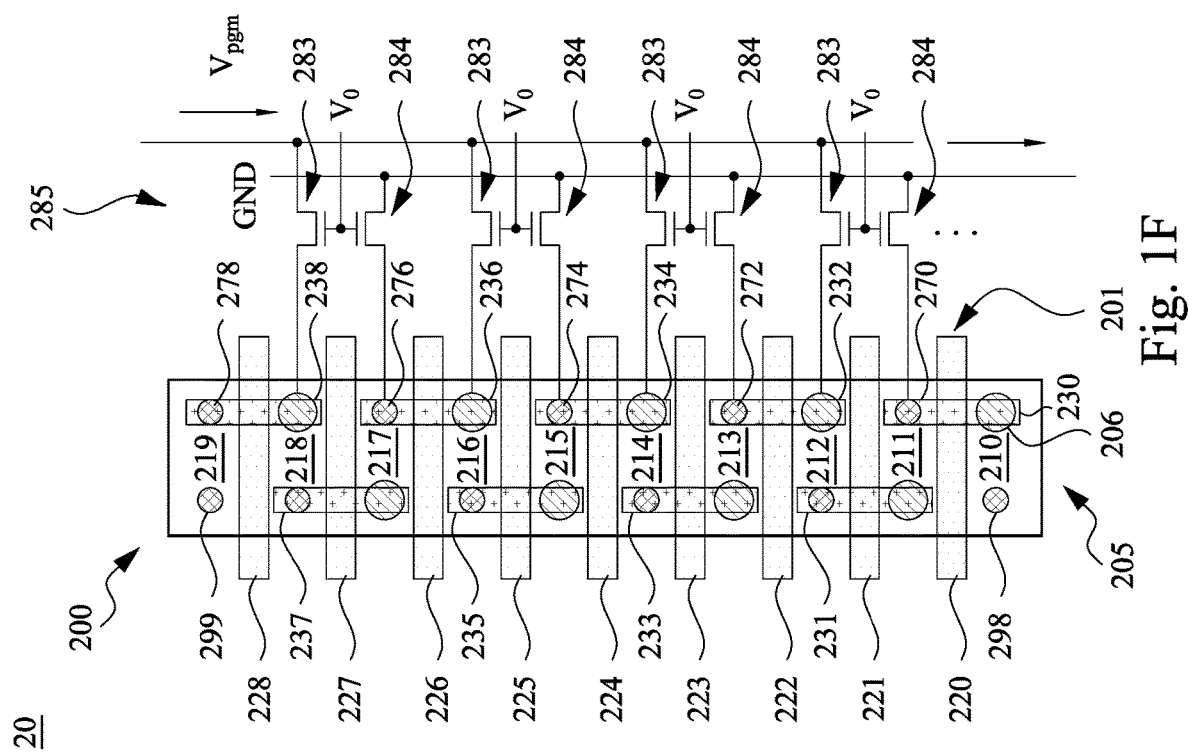
FIGS. 1F and 1G illustrate schematic top views of semiconductor structures including resistive memory strings with circuits for operating the resistive memory strings in accordance with some embodiments of the present disclosure.

Reference is made to FIG. 1F. FIG. 1F illustrates a top view of a semiconductor structure 20 including a resistive memory string 200 with a circuit 285 for operating the resistive memory string 200 in accordance with some embodiments of the present disclosure. In some embodiments, the resistive memory string 200 can be an NAND-type resistive memory string. The description provided refers to another embodiment of a resistive memory string 200, specifically featuring a different arrangement compared to the embodiment showcased in FIGS. 1A-1E. In this variant shown in FIG. 1F, memory cells 201, transistors 205, source/drain regions 210-219, contacts 220-228, 270-278, 298, 299, metal connections 230-238, and programmable resistors 206 are fundamentally similar to those in FIGS. 1A-1E in terms of their material and manufacturing methods. That means that the memory cells 201 can correspond to the memory cells 101, the transistors 205 can correspond to the transistors 105, the source/drain regions 210-219 can correspond to source/drain regions 110-115, the word lines 220-228 can correspond to the word lines 120-124, the contacts 270-278, 298, and 299 can correspond to the contacts 170-174, the metal connections 230-238 can correspond to the metal connections 130-134, and the programmable resistors 206 can correspond to the programmable resistors 106 in the previous figures.

The distinct difference in this embodiment lies in the arrangement of the memory cells 201 and an additional circuit 285 electrically coupled to the resistive memory string 200. The resistive memory string 200 may include nine memory cells 201 connected in series. The circuit 285 can include cell select transistors 283 and ground select line transistors 284. Source/drain regions of the cell select transistors 283 are electrically coupled to the source/drain regions 232, 234, 236, and 238 through the programmable resistors 206, and source/drain regions of the ground select line transistors 284 are electrically coupled to the source/drain regions 231, 233, 235, and 237. Gates of the cell select transistors 283 are electrically coupled to gates of the ground select line transistors 284, respectively.

Selecting at least one of the memory cells 201 within the resistive memory string 200 is for operations like reading, writing, or erasing data in that selected memory cell 201. This selection can be done using operating voltages applied to the selected transistors (e.g., cell select transistors 283, ground select line transistors 284). The gates of the cell select transistors 283 and the ground select line transistors 284 are interlinked electrically. This means that when a specific voltage is applied to the gate of one, the other can respond correspondingly. Operating voltages are applied to these gates to control the 'on' (or activating) and 'off' (deactivating) states of these transistors. Turning a transistor 'on' (i.e., making it conductive) or 'off' (i.e., making it non-conductive) can determine the path of the current in the resistive memory string 200.

When reading the memory cell 201, the cell select transistor 283 and the ground select line transistor 284 associated with the desired memory cell's in the resistive memory string 200 are turned 'on' by applying the appropriate operating voltage thereon. Meanwhile, other cell select transistors 283 and ground select line transistors 284 associated with undesired memory cells 201 in the memory string 200 are turned 'off'. This isolates the target memory cell 201, ensuring the current flows specifically through memory cell 201. The resistance of the programmable resistor 206 in the memory cell 201 can then be measured. Depending on the resistance, the memory cell's state (either '0' or '1') can be determined. To write data to the memory cell 201, a higher voltage (e.g., write voltage or programming voltage) is applied. As before, only the cell select transistor 283 and the ground select line transistor 284 associated with the target memory cell 201 are turned 'on'. This high voltage causes a change in the resistance of the programmable resistor 206 in the memory cell 201, thereby storing a '0' or a '1'. To erase data to the memory cell 201, a different voltage (e.g. erase voltage) is applied. Just like in the read and write operations, the cell select transistor 283 and the ground select line transistor 284 associated with the target memory cell 201 are turned 'on' during the erase operation. This erase voltage resets the resistance of the programmable resistor 106 in the memory cell 101 to its initial state.

Therefore, the application of specific operating voltages to the gates of the cell select transistors 283 and the ground select line transistors 284 can be a precise method for selecting and operating individual memory cells 201 within the resistive memory string 200. This technique ensures accurate reading, writing, and erasing of data in the desired memory cell 201 while preventing unintentional changes to neighboring memory cells 201.

Figure 1G:
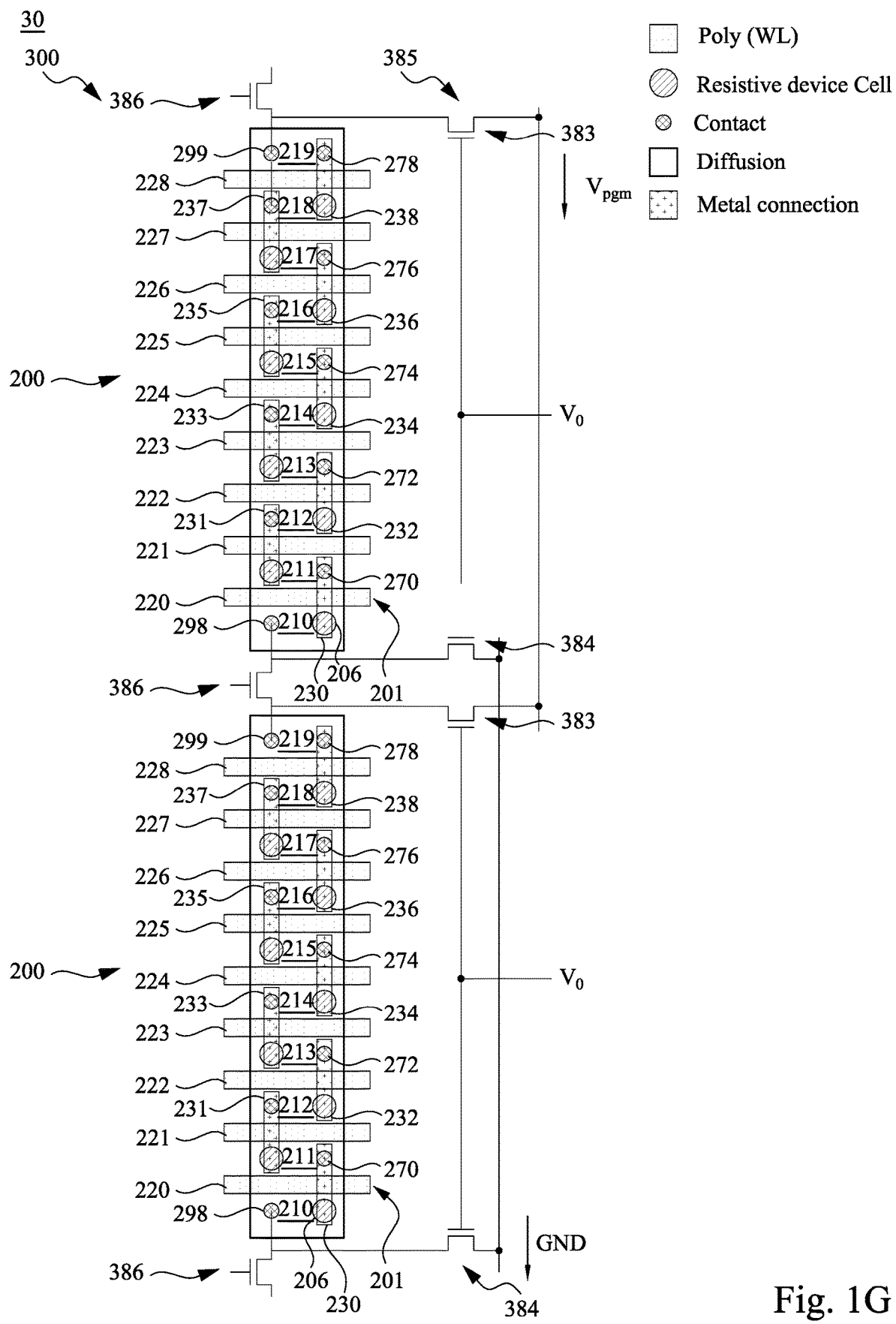

Reference is made to FIG. 1G. FIG. 1G illustrates a top view of a semiconductor structure 30 including a resistive memory string 300 with a circuit 385 for operating the resistive memory string 300 in accordance with some embodiments of the present disclosure. While FIG. 1G shows an embodiment of the semiconductor structure 30 with different structure configurations than the semiconductor structure 20 in FIG. 1F. In addition, the present disclosure may repeat reference numerals and/or letters in the various examples. This repetition is for the purpose of simplicity and clarity and does not in itself dictate a relationship between the various embodiments and/or configurations discussed.

As shown in FIG. 1G, the difference between the embodiment in FIG. 1G and the embodiment in FIG. 1F is in that the resistive memory string 300 can include a plurality of resistive memory string 200 connected in series with at least one assist transistor 386. In some embodiments, the resistive memory string 200 shown in FIG. 1G can be interchangeable referred to as a sub-resistive memory string. Specifically, taking two series-connected resistive memory strings 200 as an example, the assist transistor 386 can be electrically coupled a second terminal one (i.e., the source/drain region 219) of the source/drain regions 210-219 in the first resistive memory string 200 to the first terminal one (i.e., the source/drain regions 210) of the source/drain regions 210-219 in the second resistive memory string 200.

In addition, the circuit 385 can include string select transistors 383 and ground select line transistors 384. Source/drain regions of the string select transistors 383 can be electrically coupled to the second terminal ones (i.e., the source/drain regions 219) of the source/drain regions 210-219 in the first and second resistive memory strings 200. Source/drain regions of the ground select line transistors 384 can be electrically coupled to the first terminal ones (i.e., the source/drain regions 210) of the source/drain regions 210-219 in the first and second resistive memory strings 200 opposite to the first terminal ones. Gates of the string select transistors 383 are electrically coupled to gates of the ground select line transistors 384, respectively.

Selecting at least one of resistive memory string 200 (or sub-string) is for operations like reading, writing, or erasing data in that selected resistive memory string 200. This selection can be done using operating voltages applied to the select transistors (e.g., string select transistors 383, ground select line transistors 384). The gates of the string select transistors 383 and the ground select line transistors 384 are interlinked electrically. This means that when a specific voltage is applied to the gate of one, the other can respond correspondingly. Operating voltages are applied to these gates to control the 'on' (or activating) and 'off' (deactivating) states of these resistive memory string 200. Turning a resistive memory string 'on' (i.e., making it conductive) or 'off' (i.e., making it non-conductive) can determine the path of the current in the resistive memory string 300.

Once the desired resistive memory string 200 is selected, a read voltage can be applied across the selected memory cells 201 in the resistive memory string 200. Depending on the resistance state of the memory cell 201 (either low resistance or high resistance), the amount of current flowing through it can be determined. This current can then be used to ascertain whether the memory cell 201 is in a programmed or erased state. A write voltage (or programming voltage), higher than the read voltage, can be applied across the memory cells 201 in the resistive memory string 200, causing it to change its resistance state. Depending on the type of resistive memory, the resistance could either increase or decrease, thus programming the memory cell 201 in the selected resistive memory string 200. An erase voltage, typically different from the write voltage, can be applied to revert the memory cell 201 in the selected resistive memory string 200 to its initial state. In some embodiments, the operating voltages can be removed from the gates of both the string select transistor 383 and the ground select line transistor 384. Turning the string select transistor 383 and the ground select line transistor 384 OFF can ensure that the selected memory string 200 (or sub-string) is isolated, preventing any unintentional operations on it.

The presence of both string select transistors 383 and ground select line transistors 384 can allow for precise selection of individual resistive memory strings 200 (or sub-strings). This can ensure that only the desired resistive memory string 200 can be accessed for operations, minimizing interference and crosstalk with adjacent resistive memory strings 200. In some embodiments, the capability to turn OFF the string select transistor 383 and the ground select line transistor 384 after operations can ensure that unintentional reads/writes can be minimized. This isolation can further ensure data integrity and reduce power leakage in the semiconductor structure 30.

Figure 2A:
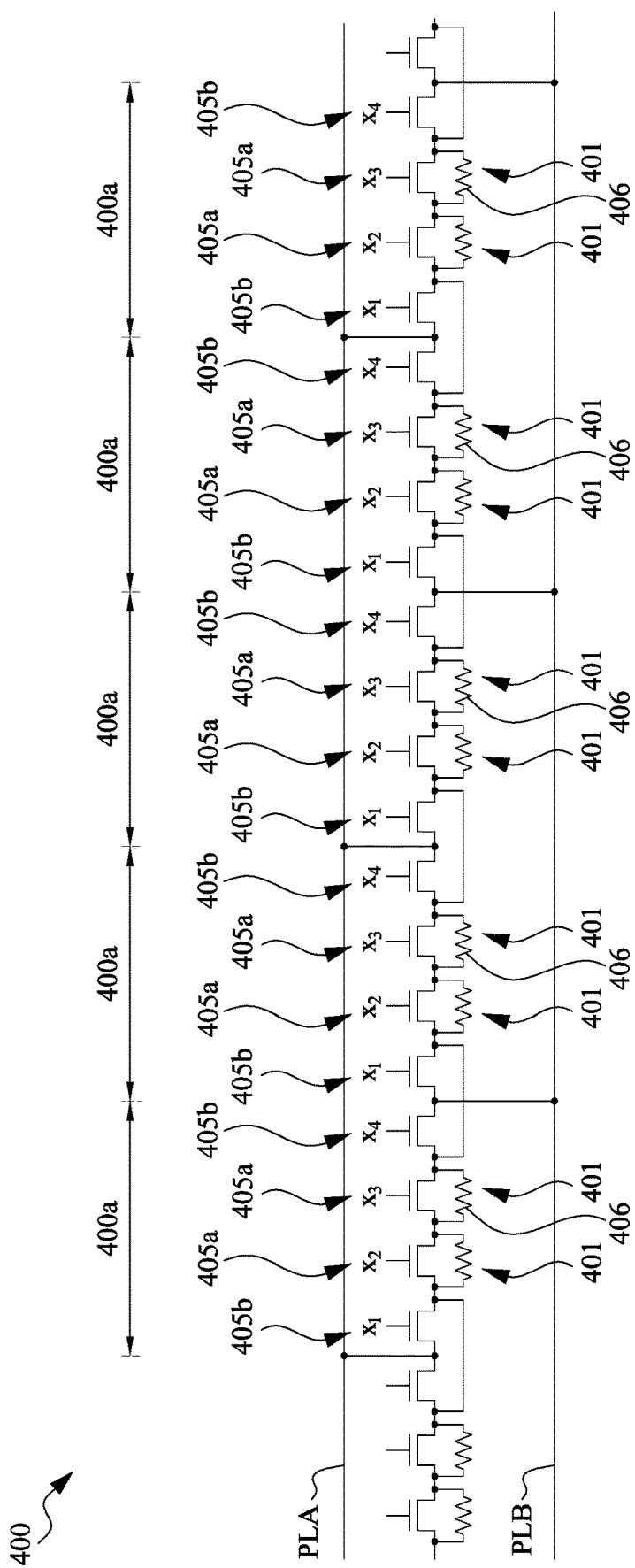
FIG. 2A illustrates a schematic circuit diagram of a resistive memory string in accordance with some embodiments of the present disclosure.
Figure 2B:
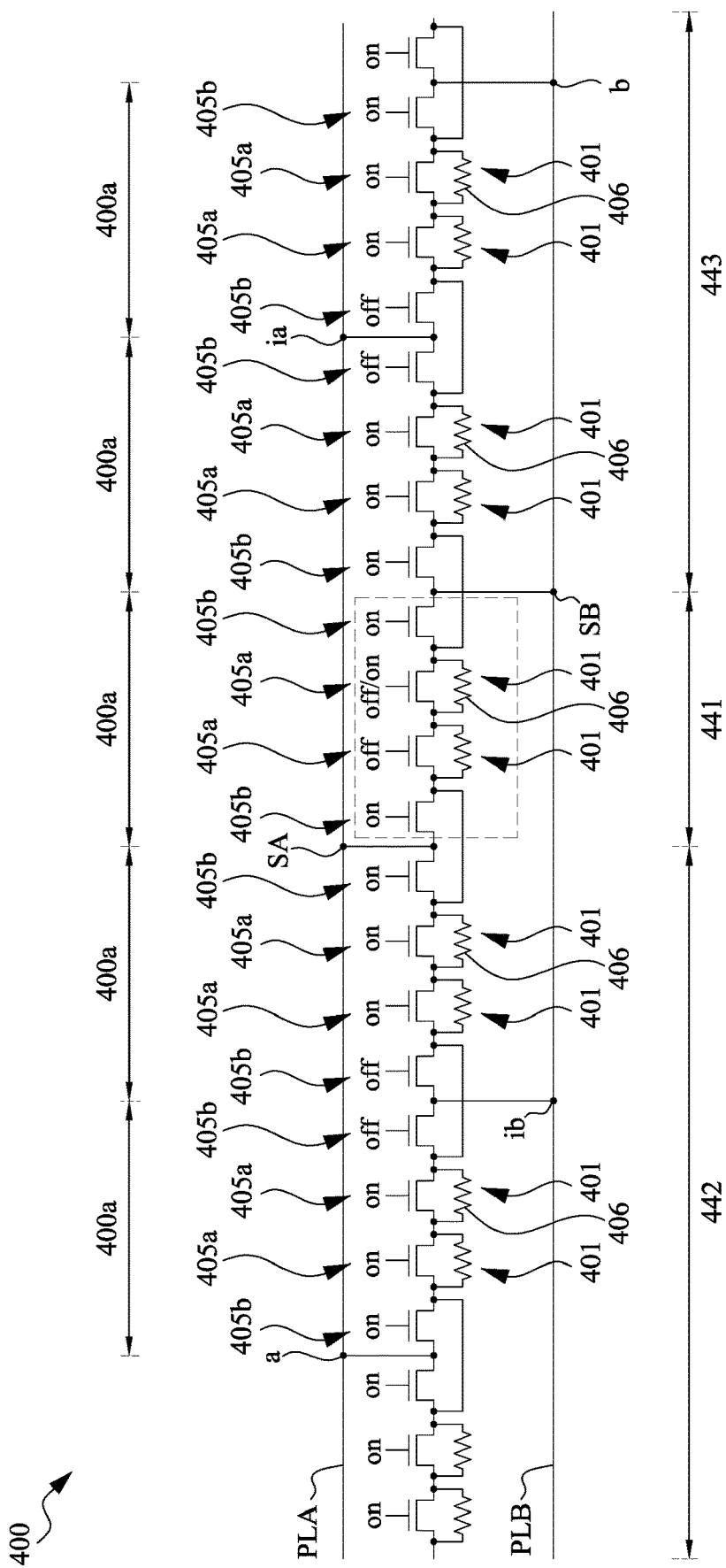
FIGS. 2B and 2C illustrate schematic equivalent circuit diagrams of methods for operating the resistive memory string in FIG. 2A.
Figure 2C:
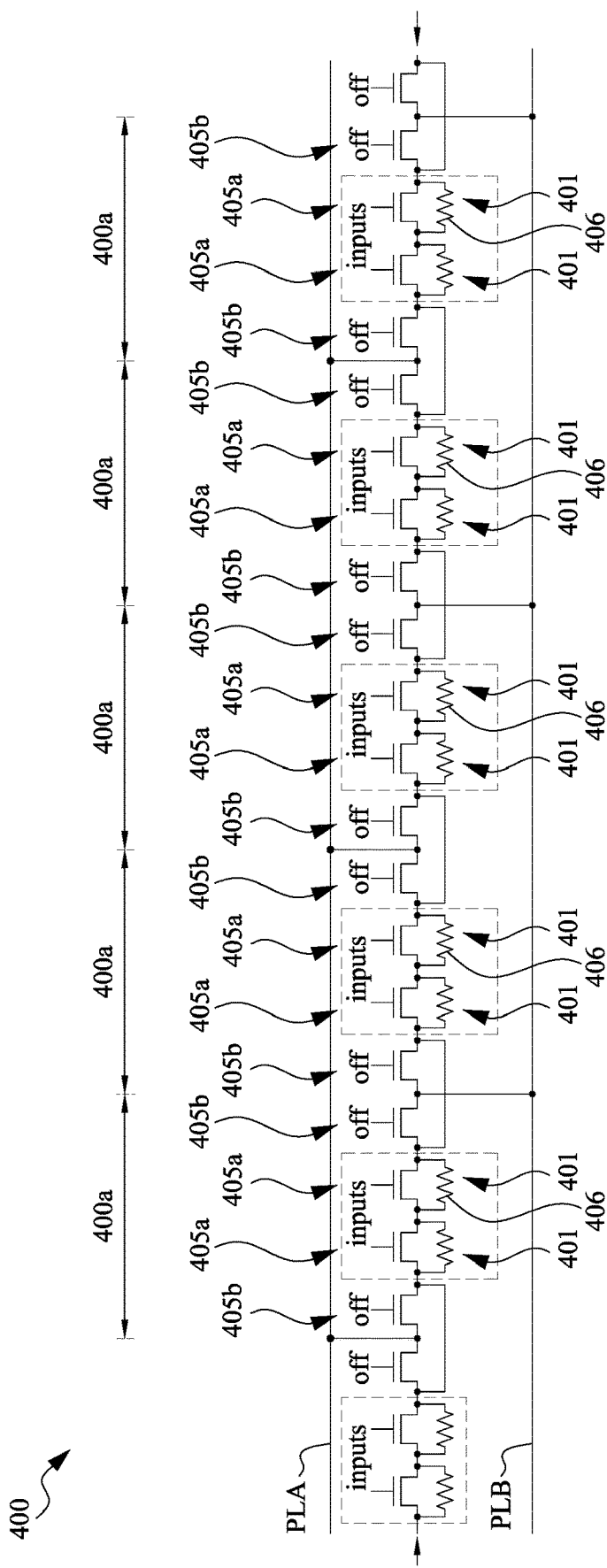
Figure 2D:
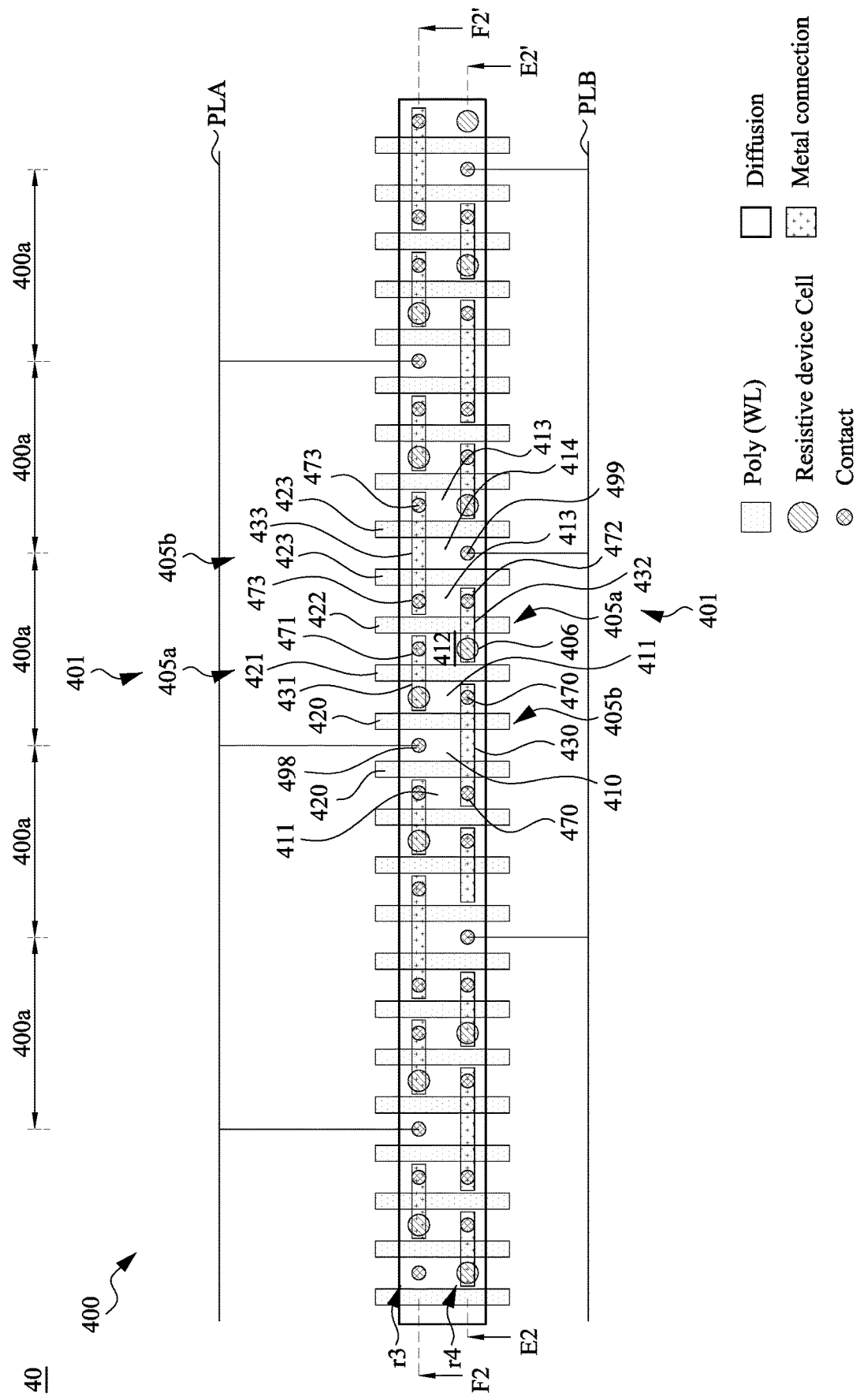
FIG. 2D illustrates a schematic top view of a semiconductor structure including a resistive memory string in accordance with some embodiments of the present disclosure.
Figure 2E:
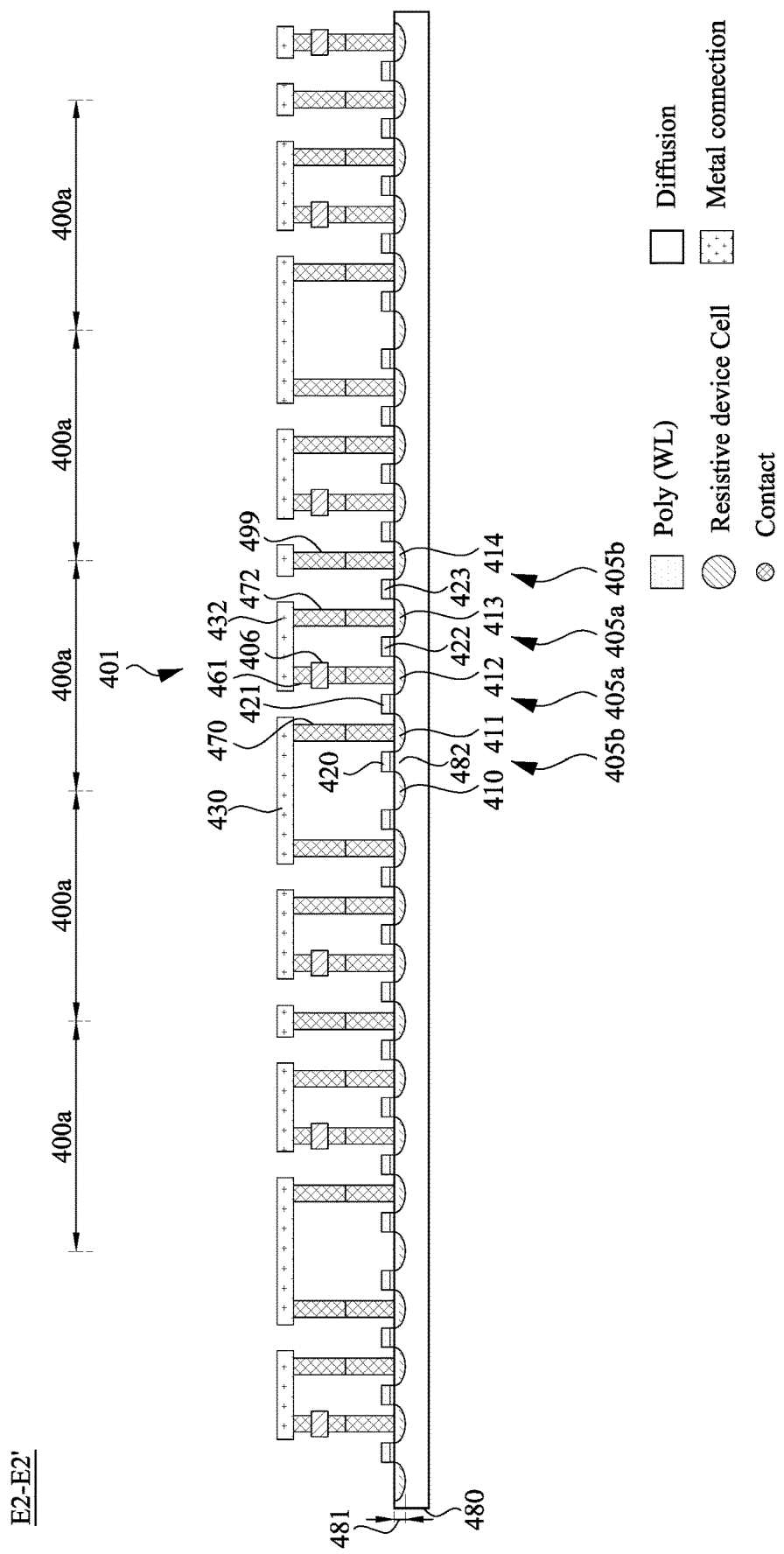
FIGS. 2E and 2F illustrate schematic cross-sectional views obtained from reference cross-sections E2-E2' and F2-F2' in FIG. 2D.
Figure 2F:
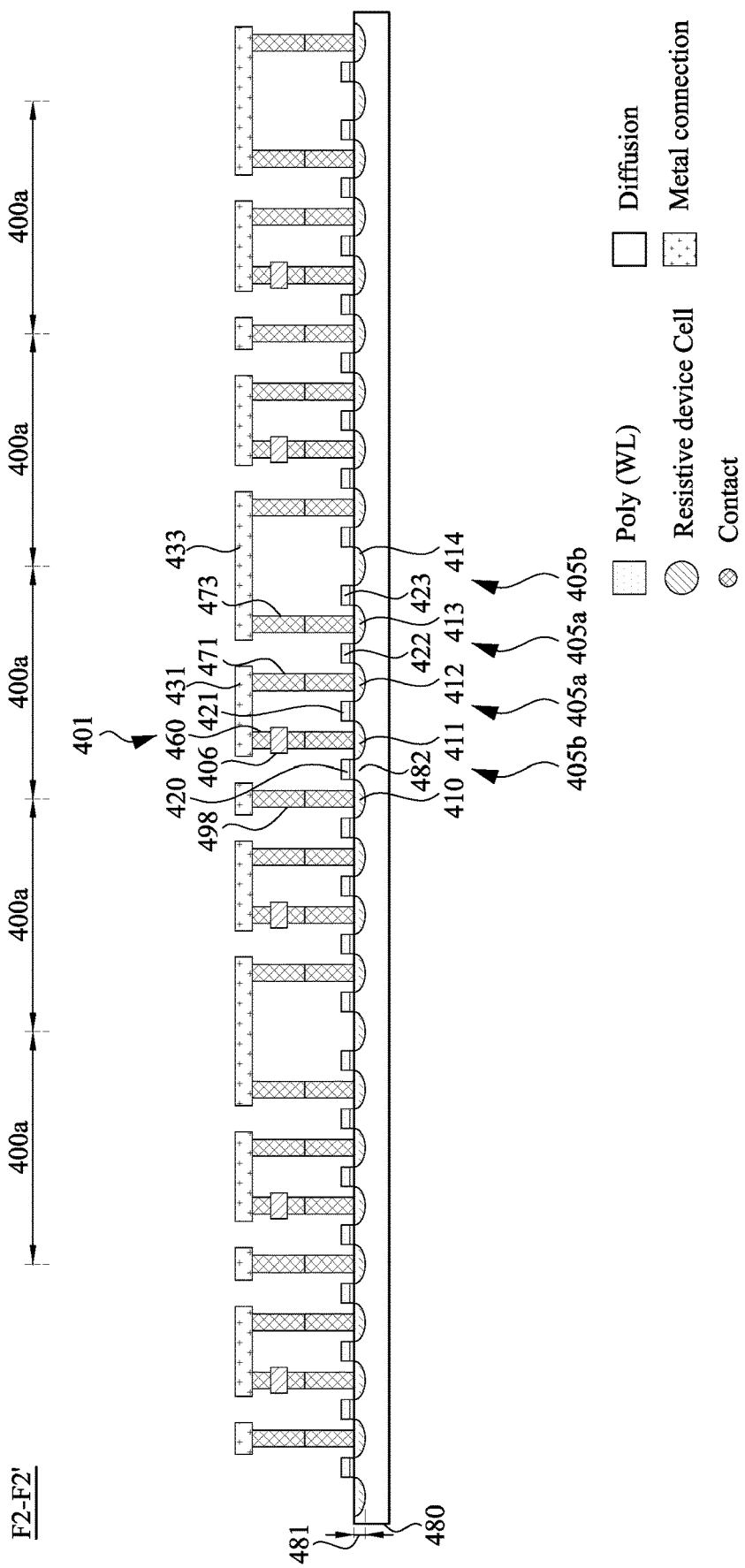

Reference is made to FIGS. 2A-2F. FIG. 2A illustrates a schematic circuit diagram of a resistive memory string 400 in accordance with some embodiments of the present disclosure. In some embodiments, the resistive memory string 400 can be an NAND-type resistive memory string. FIGS. 2B and 2C illustrate schematic equivalent circuit diagrams of methods for operating the resistive memory string 400 in FIG. 2A. FIG. 2D illustrates a schematic top view of a semiconductor structure 40 including the resistive memory string 400 in accordance with some embodiments of the present disclosure. FIGS. 2E and 2F illustrate schematic cross-sectional views obtained from reference cross-sections E2-E2' and F2-F2' in FIG. 2D.

The description provided refers to another embodiment of the resistive memory string 400, specifically featuring a different arrangement compared to the embodiment showcased in FIGS. 1A-1G. The resistive memory string 400 can include a plurality of sub-resistive memory strings 400a, and the sub-resistive memory string 400a can include at least one transistor 405a and a pair of transistors 405b at opposite terminal ends of the sub-resistive memory strings 400a. As shown in FIG. 2A, each of the sub-resistive memory strings 400a may include two memory cells 401. Other embodiments may contain more or fewer number of the memory cells 401.

In some embodiments, the sub-resistive memory string 400a can be interchangeably referred to as a cell group. In this variant shown in FIG. 2A, memory cells 401, transistors 405a and 405b, and programmable resistors 406 are fundamentally similar to those in FIG. 1B in terms of their material and manufacturing methods. That means the memory cells 401 can correspond to the memory cells 101, the transistors 405a and 405b can correspond to the transistors 105, and the programmable resistors 406 can correspond to the programmable resistors 106 in the previous figures.

The distinct difference in this embodiment lies in addition pair of transistors 405b. The sub-resistive memory strings 400a are electrically connected in series with the terminal transistors 405b using a sharing source/drain region of the terminal transistors 405b. In addition, a non-sharing source/drain region of the transistor 405b is electrically coupled to another non-sharing source/drain region of the adjacent terminal transistor 405b. In some embodiments, voltages applied to control terminals 404 (or word lines) of the memory cells 401 correspond to the variable inputs x1, x2, x3, and x4. In some embodiments, the transistor 405a can be interchangeably referred to as a word line transistor, and the transistor 405b can be interchangeably referred to as a terminal transistor.

As shown in FIG. 2A, a power line PLA and a power line PLB are connected to the resistive memory string 400 from pickup terminals between every adjacent two sub-resistive memory strings 400a, and the pickup terminal can be the sharing source/drain region of the adjacent two transistors 405b. The pickup terminals for the power line PLA and the pickup terminals for the power line PLB are arranged alternately. The first operation voltage (e.g., high voltage or programming voltage $V_{pgm}$) can be applied on the power line PLA, the second operation voltage (e.g., low voltage or ground voltage GND) can be applied on the power line PLB, and the second operation voltage is different (or lower) than the first operation voltage.

In the process of determining which sub-resistive memory string 400a to activate, the transistors 405b located at the opposing endpoints of the sub-resistive memory string 400a are toggled to an 'on' status. This configuration can allow one endpoint of the selected sub-resistive memory string 400a to receive the first operation voltage supplied by power line PLA, while the opposite endpoint receives the second operation voltage supplied by the power line PLB. This arrangement can establish a voltage difference between these endpoints, facilitating the current flow from one end to the other within the selected sub-resistive memory string 400a. Consequently, this active configuration of the sub-resistive memory string 400a can be referred to as 'selected'. Operations on the programmable resistors 406 within the selected memory cell 401, such as reading, writing, or erasing data, can be facilitated by toggling the corresponding transistor 405a within the selected sub-resistive memory string 400a.

On the other hand, the transistors 405b located at the opposing endpoints of each of the non-selected sub-resistive memory strings 400a adopt a mixed configuration, with one being 'on' status and the other being 'off' status. This configuration can ensure that both endpoints of the non-selected sub-resistive memory strings 400a sustain a consistent operation voltage, either the first operation voltage supplied by the power line PLA or the second operation voltage supplied by the power line PLB. Absence of a voltage difference between these endpoints can precludes current flow within these non-selected sub-resistive memory strings 400a, which in turn allows for preventing the programming interference.

As illustrated in FIG. 2B, for a clearly explanation of the operation of the resistive memory string 400, especially when selecting the sub-resistive memory strings 400a, specific terminals within the string 400 are labeled as a, ia, SA, b, ib, and SB. The terminals a, ia, and SA are electrically connected to the power line PLA, while terminals b, ib, and SB are electrically connected to the power line PLB. Specifically, the selected sub-resistive memory string 400a is situated between the terminals SA and SB. The non-selected sub-resistive memory strings 400a associated with the terminals a, ia, B, and ib are situated outside the bounds demarcated by the terminals SA and SB. In greater detail, the terminal a can connect the power line PLA with the resistive memory string 400, being situated closer to the terminal SA than to the terminal SB. The terminal ia can also connect the power line PLA with the resistive memory string 400 but is nearer to the terminal SB than to the terminal SA. The terminal b can connect the power line PLB with the resistive memory string 400, being situated closer to the terminal SB than to the terminal SA. The terminal ib can connect the power line PLB with the resistive memory string 400, being closer to the terminal SA than to the terminal SB.

In FIG. 2B, when both the transistors 405b within the sub-resistive memory string 400a, situated between terminals SA and SB, are activated (or set to the "on" state), the terminal SA can receive the first operation voltage (e.g., a high voltage or programming voltage $V_{pgm}$, sourced from the power line PLA). Simultaneously, the terminal SB can receive the second operation voltage (e.g., a low voltage or ground voltage GND, sourced from the power line PLB). This scenario can establish a voltage difference between the terminals SA and SB, enabling an electrical current to flow from the terminal SA to the terminal SB of the selected sub-resistive memory string 400a. This facilitates the application of both first and second operation voltages to the memory cells 401 situated within the selected sub-resistive memory string 400a, between the terminals SA and SB. In some embodiments, the regions between the terminals SA and SB can be referred to as the selected cell group region 441.

The regulation of this current flow can allow for the precise selection and operation of the memory cells 401 in the selected sub-resistive memory string 400a. This is achieved by toggling the state of the transistor 405a in the sub-resistive memory string 400a, which, in turn, controls the actions of the programmable resistors 406 in the selected memory cell 401.

Specifically, in the selected cell group region 441, if the transistor 405a is deactivated (set to the "off" state or closed) by the corresponding word line, the current can pass (or circulate) the programmable resistor 406 that is connected in parallel with the deactivated transistor 405a. This action can activate the associated memory cell 401. This configuration can permit various tasks, such as reading, writing, or erasing data, to be executed on the programmable resistor 406.

Conversely, in the selected cell group region 441, when the transistor 405a is activated (set to the "on" state or opened) by the corresponding word line, the current predominantly circulates through the transistor 405a, bypassing (or non-passing) the programmable resistor 406 that is connected in parallel with the activated transistor 405a. As a result, this programmable resistor 406 remains inactive or non-operational.

For the sub-resistive memory string 400a between the terminals SA and ib, and between the terminals a and ib, when one side's transistor 405b is activated (or set to "on") and the other side's is deactivated (or set to "off"), all voltages between the terminals a and SA will remain consistent with (or stabilize at) the first operation voltage (e.g., the programming voltage $V_{pgm}$, provided by the power line PLA). Therefore, there is no voltage difference (or gradient) being established, ensuring that current doesn't flow through these non-selected sub-resistive memory strings 400a, thus eliminating any potential operation disturbance. This region, maintained at the first operation voltage between the terminals a and SA, can be referred to as the first operation voltage inhibition region 442.

Similarly, for the sub-resistive memory string 400a between the terminals SB and ia, and between the terminals b and ia, when one side's transistor 405b is activated (or set to "on") and the opposing side's is deactivated (or set to "off"), all voltages between the terminals SB and b will remain consistent with (or stabilize at) the second operation voltage (e.g., the ground voltage GND, provided by the power line PLB). Again, the absence of a voltage difference (or gradient) can ensure that current doesn't flow through these non-selected sub-resistive memory strings 400a, thus eliminating any potential operation disturbance. This region, maintained at the second operation voltage between terminal b and terminal SB, can be referred to as the second operation voltage inhibition region 443.

That is, the transistors 405b associated with the terminals a and b are activated. This can enable the delivery of an inhibit voltage (which could either be the first or second operation voltage) to the unselected sub-resistive memory string 400a situated between the terminals a and b, which in turn prevents any potential operational disturbances in the first and second operation voltage inhibition regions 442 and 443. In contrast, the transistors 405b associated with the terminals ia and ib are inactivated. This can ensure that the first and second operation voltages don't interfere with the non-selected sub-resistive memory strings 400a within the first and second operation voltage inhibition regions 442 and 443.

Within the first operation voltage inhibition region 442, the word lines 421 and 422 can be selected to activate the transistors 405a, thereby opening them. This action can ensure that the first operation voltage can be diverted away from the programmable resistors 406 that are connected in parallel to the transistors 405a. Similarly, within the second operation voltage inhibition region 443, the word lines 421 and 422 can be selected to activate the transistors 405a, thereby opening them. This action can ensure that the second operation voltage can be diverted away from the programmable resistors 406 that are connected in parallel to the transistors 405a.

As shown in FIG. 2D, the resistive memory string 400 can include a sequence of source/drain regions 410-414, which act as source/drain terminals of a sequence of the transistors 405a and 405b in this illustration. The gates of the transistors 405a and 405b can be provided on word lines 420-423. Parallel resistors 406 are implemented in each of the memory cells 401 using a current path that bridges the transistor 405a. Contacts 498 and 499 can connect to overlying conductors (not shown), which can connect to the power lines PLA and PLB. In some embodiments, the contacts 498 and 499 can be interchangeably referred to as pickup connections.

Specifically, the resistive memory strings 400 can be constructed after a contact formation process, and a subsequent metal routing process can be performed to connect adjacent two of the memory cells 401 with each other, and adjacent two of the sub-resistive memory strings 400a with each other. Every source/drain region (e.g., source/drain regions 411-413) in the sub-resistive memory string 400a can be interconnected with two adjacent source/drain regions, excluding the source/drain region at the ending terminal ones (e.g., source/drain regions 410 and 414) of the sub-resistive memory string 400a. Each conductive terminal has dual contacts (e.g., two of the contacts 470-473 and the contacts 460-461 (see FIGS. 2E and 2F)) to facilitate these interconnections with neighboring source/drain regions.

In some embodiments, the metal routing (e.g., metal connections 431 and 432) can connect the memory cell 401 using a first contact (either from the contact 460 or 461 shown in FIGS. 2E and 2F) to a second contact (either from the contact 471 or 472) on the neighboring conductive terminal. In some embodiments, the metal routing (e.g., metal connections 430 and 433) can connect a first sub-resistive memory string 400a using a first contact (either from the contact 470 or 473) to a second contact (either from the contact 473 or 470) on the neighboring second sub-resistive memory string 400a, thereby constructing the resistive memory string 400.

With the configuration of the memory cells 401 containing parallel resistors 406 bridging the transistors 405a, and the source/drain regions 410-414 acting as source/drain terminals, the design can be compact. This layout can allow for higher memory density, which means more data can be stored in a smaller area. The design offers a method of interconnecting the memory cells 401 and the sub-resistive memory string 400a. Every source/drain region (e.g., the source/drain regions 411-413) connects to two neighboring terminals, except at the ending terminal ones (e.g., the source/drain regions 410 and 414). This flexibility can improve data flow, potentially speeding up read/write operations.

Specifically, in a first one of the memory cells 401 formed over the source/drain regions 411 and 412, a contact 460 (see FIG. 2E) including the programmable resistor 406 can be formed to be in electrical contact with the source/drain region 411, a contact 471 can be formed to be in electrical contact with the source/drain region 412, and a metal connection 431 can be formed to laterally extend from above the programmable resistor 406 across the word line 421 to above the contact 471. That is, the pair of contacts 460 and 471 is formed over the source/drain regions 411 and 412, wherein the programmable resistor 406 is over the contact 460 and free from coverage of the contact 471.

In a second one of the memory cells 401 formed over the source/drain regions 412 and 413, a contact 461 (see FIG. 2F) including the programmable resistor 406 can be formed to be in electrical contact with the source/drain region 412, a contact 472 can be formed to be in electrical contact with the source/drain region 413, and a metal connection 432 can be formed to laterally extend from above the programmable resistor 406 across the word line 422 to above the contact 472. In other words, the pair of contacts 461 and 472 is formed over the source/drain regions 412 and 413, wherein the programmable resistor 406 is over the contact 461 and free from coverage of the contact 472.

The contact 470 can be formed on the source/drain region 411 in a first one of the sub-resistive memory strings 400a, and the metal connection 430 can be formed to laterally extend from above the contact 470 across the word lines 420 in the first and second ones of the sub-resistive memory strings 400a to above the contact 473 formed on the source/drain region 411 in the second one of the sub-resistive memory strings 400a. The contact 470 in the first one of the sub-resistive memory strings 400a and the contact 473 in the second one of the sub-resistive memory strings 400a can define a metal contact-free region therebetween underlying the metal connection 430.

Similarly, the contact 473 can be formed on the source/drain region 414 in the first one of the sub-resistive memory strings 400a, and the metal connection 433 can be formed to laterally extend from above the contact 473 across the word lines 423 in the first and third ones of the sub-resistive memory strings 400a to above the contact 473 formed on the source/drain region 414 in the third one of the sub-resistive memory strings 400a. The contact 473 in the first one of the sub-resistive memory strings 400a and the contact 470 in the third one of the sub-resistive memory strings 400a can define a metal contact-free region therebetween underlying the metal connection 433.

The metal connections 430-433 can be arranged in two rows r3 and r4 with each of the metal connection 430-433 being shifted relative to a next one of the metal connection 430-433 along lengthwise directions of the word lines 420-423 from the top view, optimizing space utilization and ensuring a clear path for currents. This setup can minimize interference and cross-talk between adjacent paths, ensuring more accurate data transfer. Specifically, the metal connections 430 and 432 can be arranged in the row r4, and the metal connections 431 and 433 can be arranged in the row r3 in parallel with the row r4. Similarly, the programmable resistors 406 can be arranged in the two rows r3 and r4 with each of the programmable resistors 406 being shifted relative to a next one of the programmable resistors 406 along the lengthwise directions of the word lines 420-423. Therefore, the resistive memory string 400 can offer a compact, flexible, and reliable layout for memory storage.

As shown in FIGS. 2D and 2E, a diffusion region 481 can be formed over a substrate 480. The word lines 420-423 formed over the diffusion region 481. The source/drain regions 410-414 formed at opposite sides of the word lines 420-423. Channel regions 482 are formed underlying the word lines 420-423. Each of the transistors 405a and 405b may include the channel region 482, a corresponding one of the word lines 420-423, and a corresponding pair of the source/drain regions 410-414.

The transistors 405a in two adjacent memory cells 401 share the same source/drain region 412, and the memory cells 401 are connected in series using the sharing source/drain region 412. The transistors 405b in two adjacent sub-resistive memory strings 400b share the same source/drain region 410 or 414, and the sub-resistive memory strings 400a are connected in series using the sharing source/drain region 410 or 414. The programmable resistors 406 are formed to dispose in the contacts 460 and 461, and spaced away from the metal connections 431 and 432 by a vertical distance. In some embodiments, the metal connections 430-433 may be made of a different material than the contacts 460, 461, 470-473, 498, and 499. In some embodiments, the metal connections 430-433 may be made of a same material as the contacts 460, 461, 470-473, 498, and 499.

In this variant shown in FIGS. 2A-2F, the substrate 480, the diffusion region 481, the source/drain regions 410-114, the word lines 420-423, the contacts 460, 461, 470-473, 498, and 499, and the metal connections 430-433 are fundamentally similar to those in FIGS. 1A-1E in terms of their material and manufacturing methods. That means the substrate 480 can correspond to the substrate 180, the diffusion region 481 can correspond to the diffusion region 181, the source/drain regions 410-114 can correspond to source/drain regions 110-115, the word lines 420-423 can correspond to the word lines 120-124, the contacts 460, 461, 470-473, 498, and 499 can correspond to the contacts 160-164, 170-174, 198, and 199, and the metal connections 430-433 can correspond to the metal connections 130-134 in the previous figures.

Reference is made to FIG. 2C. The in-storage computing, often referred to as computing-in-memory (CiM), can be integrated into the resistive memory string 400 to elevate its functional capacity. The in-storage computing may include a series of steps and begin by grounding both power lines PLA and PLB. Subsequently, all the transistors 405b within the resistive memory string 400 are deactivated, ensuring data integrity. Subsequently, data inputs are directed towards the word lines 421 and 422. Subsequently, the resistances of the system, whether in voltage or current forms, are measured to obtain the CiM results. Therefore, the implementation of in-storage computing operation within the resistive memory string 400 not only amplifies its computational prowess but also fosters a seamless interface between data storage and processing functionalities.

Figure 3A:
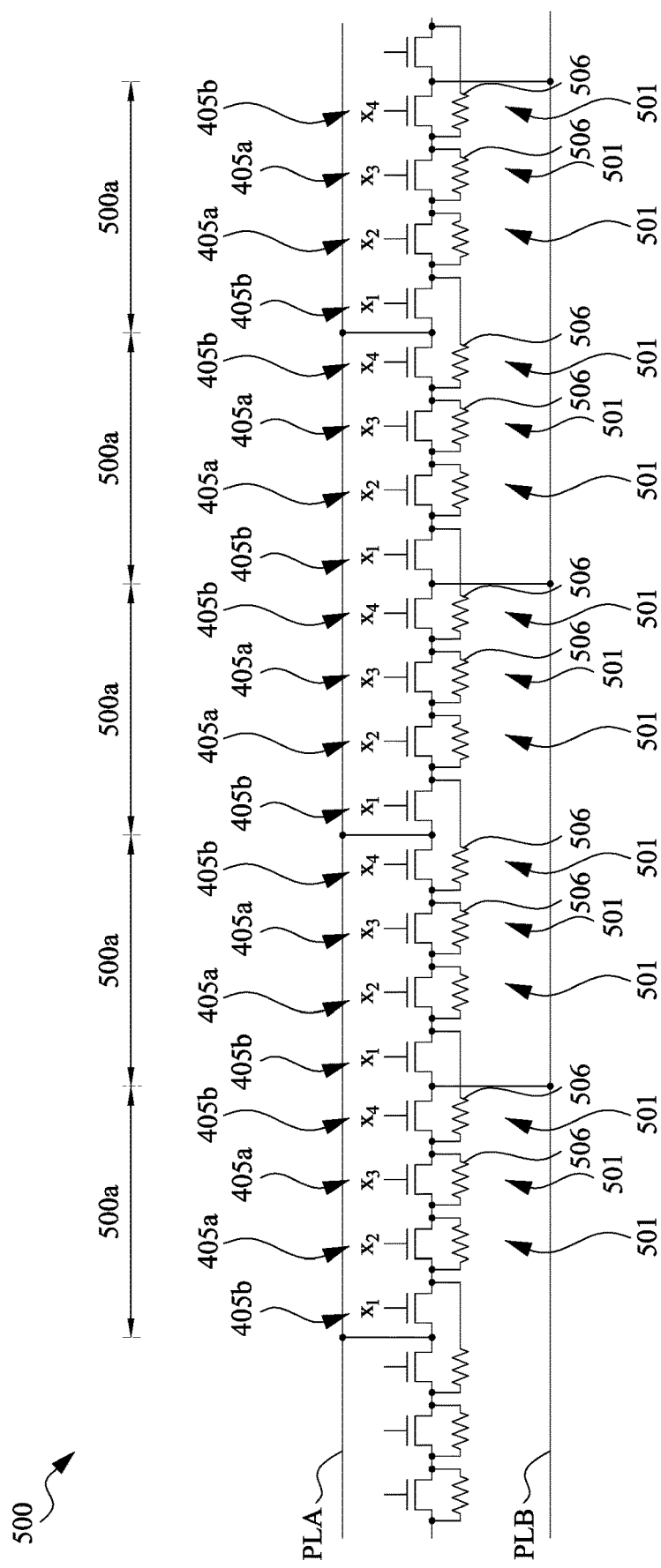
FIG. 3A illustrates a schematic circuit diagram of a resistive memory string in accordance with some embodiments of the present disclosure.
Figure 3B:
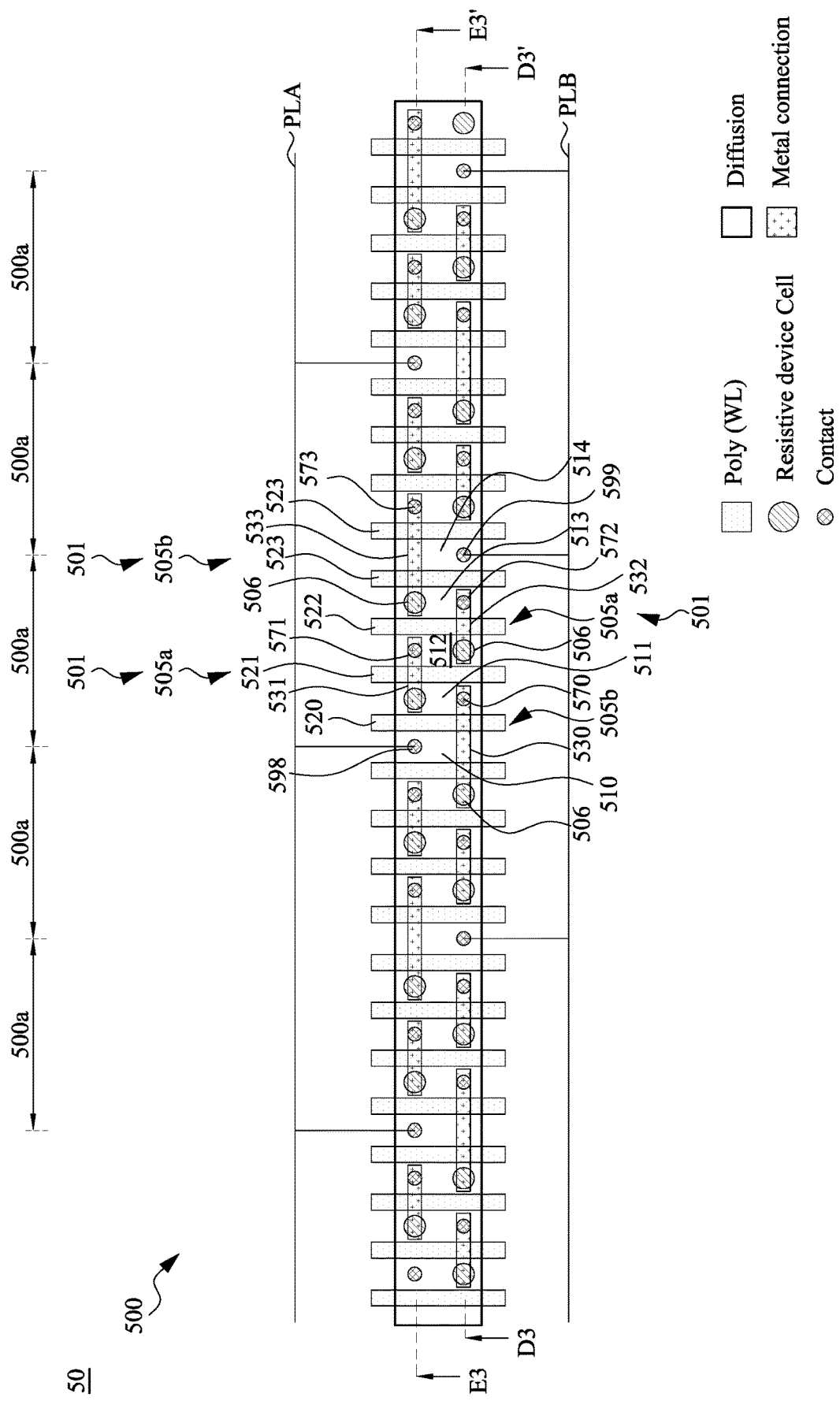
FIG. 3B illustrates a schematic top view of a semiconductor structure including a resistive memory string in accordance with some embodiments of the present disclosure.
Figure 3C:
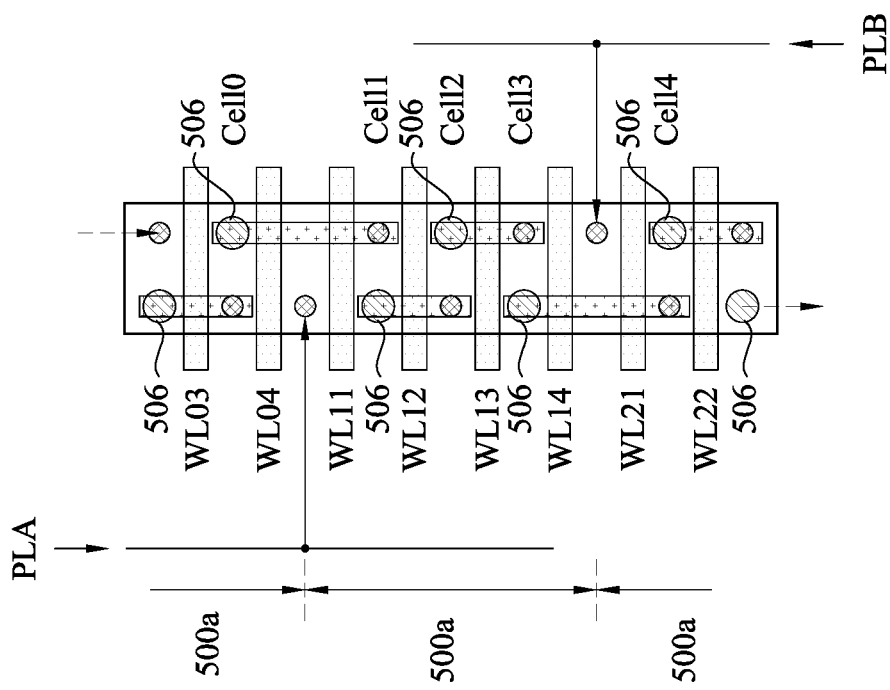
FIG. 3C illustrates a local enlarged view of a region in FIG. 3B.
Figure 3D:
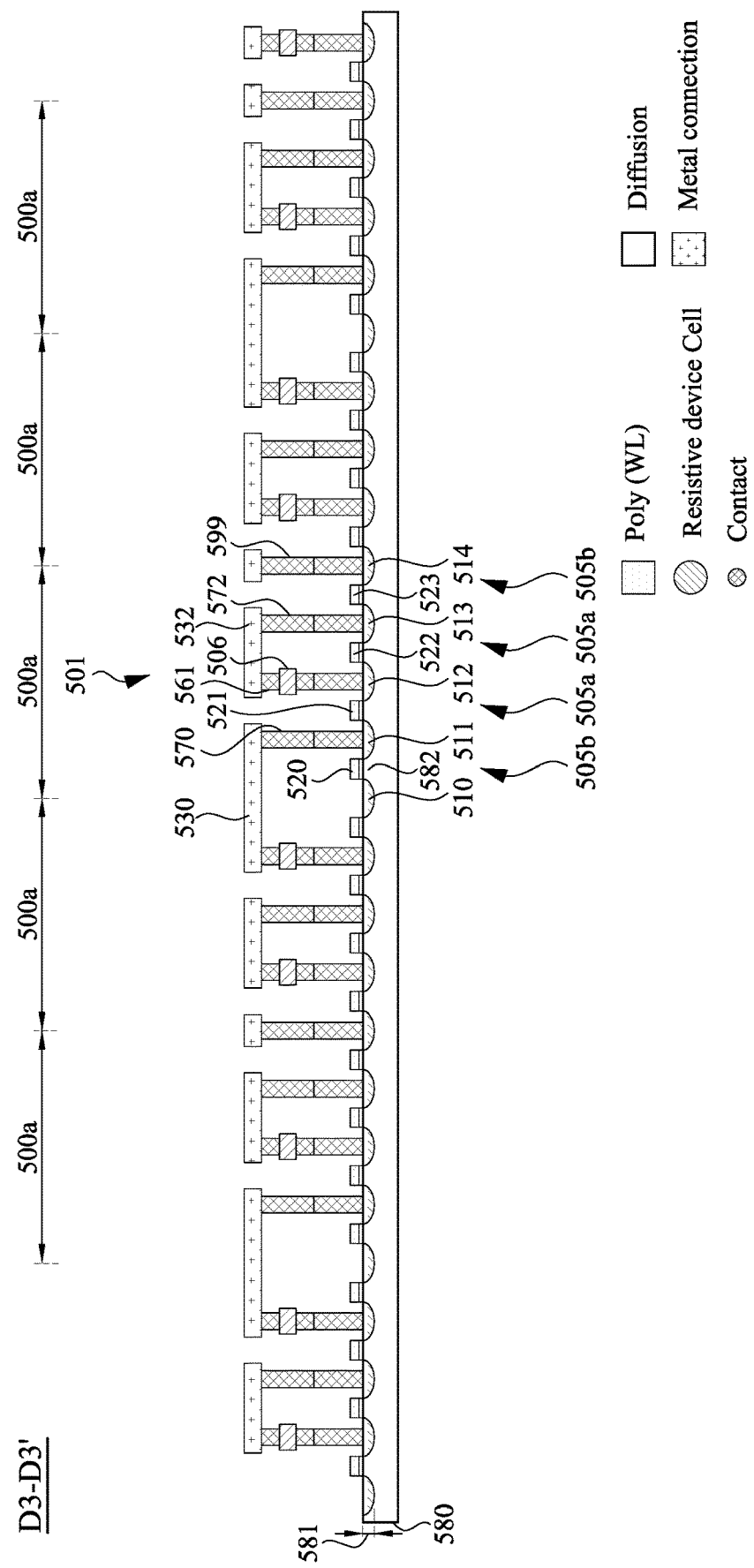
FIGS. 3D and 3E illustrate schematic cross-sectional views obtained from reference cross-sections D3-D3' and E3-E3' in FIG. 3B.
Figure 3E:
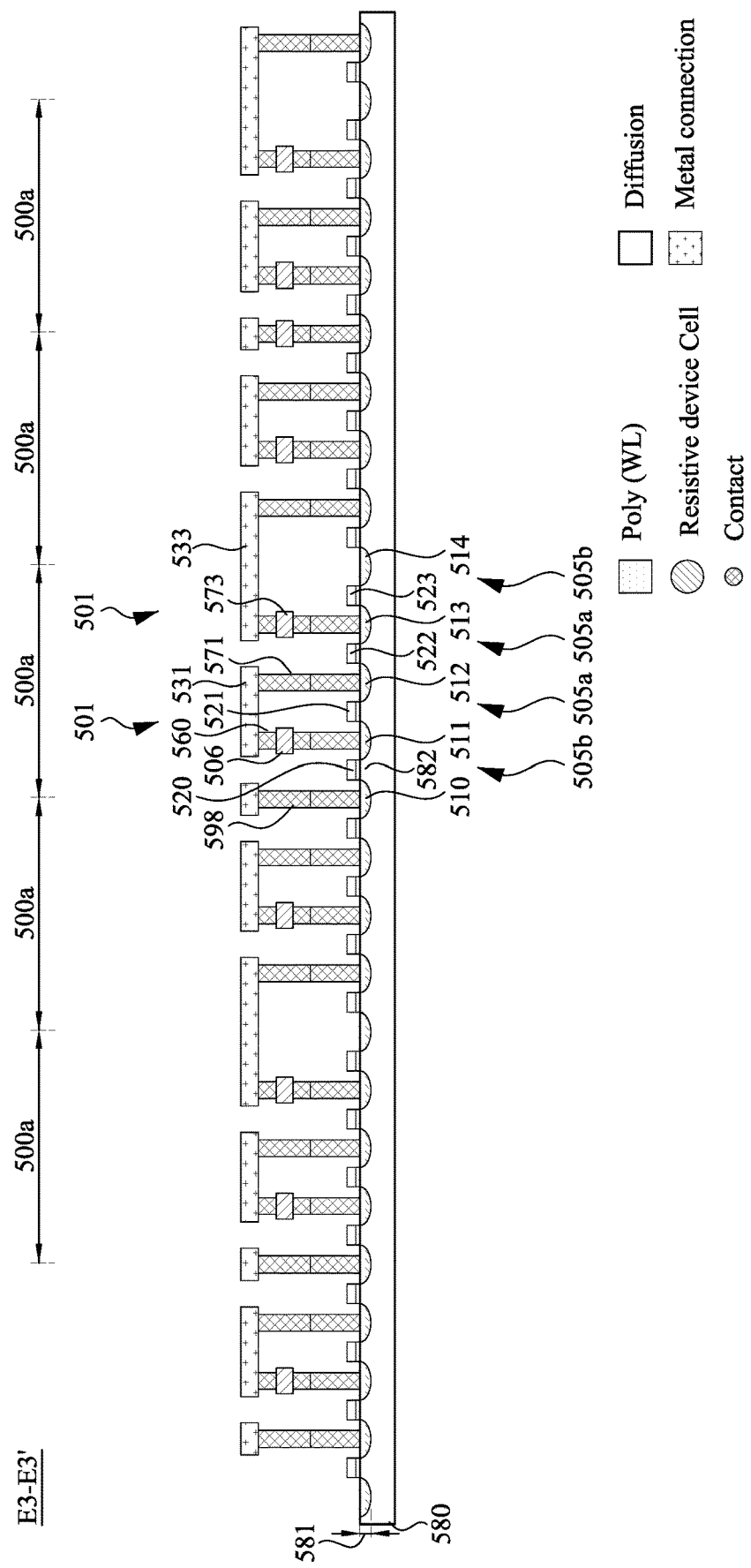

Reference is made to FIGS. 3A-3E. FIG. 3A illustrates a schematic circuit diagram of a resistive memory string 500 in accordance with some embodiments of the present disclosure. FIG. 3B illustrates a schematic top view of a semiconductor structure 50 including the resistive memory string 500 in accordance with some embodiments of the present disclosure. FIG. 3B illustrates a local enlarged view of a region in FIG. 3B. FIGS. 3D and 3E illustrate schematic cross-sectional views obtained from reference cross-sections D3-D3' and E3-E3' in FIG. 3B.

In this variant shown in FIGS. 3A-3E, the resistive memory string 500, a sub-resistive memory strings 500a, a substrate 580, a diffusion region 581, transistors 505a and 505b, word lines 520-523, source/drain regions 510-514, contacts 560, 561, 570-573, 598, and 599, metal connections 530-533, programmable resistors 506, and memory cells 501 are fundamentally similar to those in FIGS. 2A-2F in terms of their material and manufacturing methods. That means that the resistive memory string 500 can correspond to the resistive memory string 400, the sub-resistive memory strings 500a can correspond to the sub-resistive memory strings 400a, the substrate 580 can correspond to the substrate 480, the diffusion region 581 can correspond to the diffusion region 481, transistors 505a and 505b can correspond to transistors 405a and 405b, the word lines 520-523 can correspond to the word lines 420-423, the source/drain regions 510-514 can correspond to the source/drain regions 410-414, the contacts 560-562, 570-572, 598, and 599 can correspond to the contacts 460, 461, 470-473, 498, and 499, the metal connections 530-533 can correspond to the metal connections 430-433, the programmable resistors 506 can correspond to the programmable resistors 406, the memory cells 501 can correspond to the memory cells 401 in the previous figures.

The distinct difference in this embodiment lies in additional programmable resistors 506 formed to dispose in the contacts 573 and 570 and spaced away from the metal connections 530 and 533 by vertical distances. That is, the programmable resistor 506 can be positioned at the junction where it intersects with the two transistors 505b within the series-connected sub-resistive memory strings 500a. These programmable resistors 506 not only act as series components but also function as balancing weight memory cells 501. Operational flexibility can be ensured, as programming, erasing, or reading voltages can be delivered through the power lines PLA and PLB.

As shown in FIG. 3C, to provide a clearer description of the operational method of the resistive memory string 500, new reference labels are assigned to the structure illustrated in FIG. 3C. In the selected sub-resistive memory string 500a, the word lines are WL11, WL12, WL13, and WL14. In a set sub-resistive memory string 500a neighboring the selected sub-resistive memory strings 500a, the word lines are labeled as WL03 and WL04. Meanwhile, in another adjacent sub-resistive memory string 500a, the word lines are labeled as WL21 and WL22. The power line PLA can establish an electrical connection at the pickup terminal situated between the word lines WL11 and WL04. The power line PLB can establish an electrical connection at the pickup terminal between the word lines WL14 and WL21. The programmable resistor 506 in parallel connected with the word lines WL04 and WL11 can be labeled as memory cell Cell0; the programmable resistor 506 in parallel connected with the word lines WL12 can be labeled as memory cell Cell1; the programmable resistor 506 in parallel connected with the word lines WL13 can be labeled as memory cell Cell2; the programmable resistor 506 in parallel connected with the word lines WL14 and WL21 can be labeled as memory cell Cell3; and the programmable resistor 506 in parallel connected with the word lines WL22 can be labeled as memory cell Cell4.

When the transistors associated with the word lines WL03, WL04, WL11, WL13, WL14, WL21, and WL22 are activated (i.e., set to the "on" state) and the transistor associated with the word line WL12 is deactivated (i.e., set to the "off" state), the current will flow through the programmable resistor 506 connected in parallel with the deactivated transistor, including the word line WL12. Conversely, the current will skip the programmable resistor 506 connected in parallel with the activated transistors, including the word lines WL04, WL11, WL13, WL14, and WL21. The word lines WL03 and WL22 will facilitate the supply of inhibit voltages, provided by the power lines PLA and PLB, to the unselected memory cells, which in turn reduces operational disruptions in the resistive memory string 500. The memory cell Cell1 can be changeable referred to as the selected memory cell.

When the transistors associated with the word lines WL03, WL04, WL11, WL12, WL14, WL21, and WL22 are activated (i.e., set to the "on" state) and the transistor associated with the word line WL13 is deactivated (i.e., set to the "off" state), the current will flow through the programmable resistor 506 connected in parallel with the deactivated transistor, including the word line WL13. Conversely, the current will skip the programmable resistor 506 connected in parallel with the activated transistors, including the word lines WL04, WL11, WL12, WL14, and WL21. The word lines WL03 and WL22 will facilitate the supply of inhibit voltages, provided by the power lines PLA and PLB, to the unselected memory cells, which in turn reduces operational disruptions in the resistive memory string 500. The memory cell Cell2 can be changeable referred to as the selected memory cell.

When the transistors associated with the word lines WL03, WL04, WL11, WL12, WL13, WL21, and WL22 are activated (i.e., set to the "on" state) and the transistor associated with the word line WL14 is deactivated (i.e., set to the "off" state), the current will flow through the programmable resistor 506 connected in parallel with the deactivated transistor, including the word line WL14. Conversely, the current will skip the programmable resistor 506 connected in parallel with the activated transistors, including the word lines WL04, WL11, WL12, WL13, and WL21. The word lines WL03 and WL22 will facilitate the supply of inhibit voltages, provided by the power lines PLA and PLB, to the unselected memory cells, which in turn reduces operational disruptions in the resistive memory string 500. The memory cell Cell3 can be changeable referred to as the selected memory cell.

The resistive memory strings described in this disclosure are versatile and can be employed for various applications, including sum-of-product computations, neural network processing, in-memory search or in-memory computing, and in-storage search or in-storage computing.

Although the present invention has been described in considerable detail with reference to certain embodiments thereof, other embodiments are possible. Therefore, the spirit and scope of the appended claims should not be limited to the description of the embodiments contained herein. The present disclosure in various embodiments provides a layout to improve the long NAND-type resistive memory string, such that the series (or loading) resistance associated with the selected memory cell can be decreased. An additional pickup connection to the long NAND-type resistive memory string is introduced. The additional pickup connection can divide the lengthy resistance string (R-string) into shorter. Furthermore, an inhibit scheme on the non-selected memory cells can be applied on the resistive memory string, ensuring the non-selected memory cells remain undisturbed during operations.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An integrated circuit structure (IC structure), comprising:
    a substrate; and
    a first resistive memory string over the substrate and comprising a plurality of memory cells, each of the memory cells comprising:
        a word line transistor comprising a channel region, a gate over the channel region, and a plurality of source/drain regions on opposite sides of the channel region; and
        a resistor over the word line transistor and being electrically connected with the word line transistor in parallel,
    wherein the word line transistors of two adjacent memory cells share a same one of the source/drain regions, and the memory cells are connected in series using the sharing ones of the source/drain regions.

2. The IC structure of claim 1, wherein the each of the memory cells further comprises:
    a pair of contacts over the source/drain regions, wherein the resistor is over a first one of the pair of contacts and free from coverage of a second one of the pair of contacts.

3. The IC structure of claim 2, wherein the each of the memory cells further comprises:
    a metal line laterally extending from above the resistor across the gate to above the second one of the pair of contacts, wherein the resistor is connected with the word line transistor in parallel using the pair of contacts and the metal line.

4. The IC structure of claim 3, wherein from a top view, the metal lines of the memory cells are arranged in two rows with each of the metal lines being shifted relative to a next one of the metal lines along lengthwise directions of the gates.

5. The IC structure of claim 1, further comprising:
    a string select transistor having a source/drain region electrically coupled to a first terminal one of the source/drain regions in the first resistive memory string; and
    a ground select line transistor having a source/drain region electrically coupled to a second terminal one of the source/drain regions in the first resistive memory string, wherein a gate of the string select transistor is electrically coupled to a gate of the ground select line transistor.

6. The IC structure of claim 5, further comprising:
    a second resistive memory string; and
    an assist transistor electrically coupled a first terminal one of source/drain regions in the second resistive memory string to the second terminal one of the source/drain regions in the first resistive memory string.

7. An integrated circuit structure (IC structure), comprising:
    a substrate having a diffusion region thereon; and
    a resistive memory string comprising:
        a first sub-string comprising first and second gates extending over the diffusion region, and a first metal contact over the diffusion region and between the first and second gates;
        a second sub-string comprising third and fourth gates extending over the diffusion region, and a second metal contact over the diffusion region and between the third and fourth gates;
        a first metal line laterally extending from above the first metal contact of the first sub-string across the second and third gates to above the second metal contact of the second sub-string; and
        a third metal contact over the diffusion region and between the second and third gates, the third metal contact being configured to applied with an operation voltage.

8. The IC structure of claim 7, wherein the first and second metal contacts define a metal contact-free region therebetween underlying the first metal line.

9. The IC structure of claim 7, wherein the second sub-string further comprises:
    fourth and fifth metal contacts over the diffusion region and at opposite sides of the fourth gate;
    a first resistor over the fourth metal contact; and
    a second metal line laterally extending from above the first resistor across the fourth gate to above the fifth metal contact.

10. The IC structure of claim 9, wherein the first and second metal contacts are arranged at a first row, and the third, fourth, and fifth metal contacts are arranged at a second row.

11. The IC structure of claim 10, wherein the first sub-string further comprises:
    sixth and seventh metal contacts over the diffusion region and at opposite sides of the first gate;
    a second resistor over the sixth metal contact; and
    a third metal line laterally extending from above the second resistor across the first gate to above the seventh metal contact.

12. The IC structure of claim 11, wherein the first and second metal contacts are arranged at a first row, and the third, fourth, fifth, sixth, and seventh metal contacts are arranged at a second row.

13. The IC structure of claim 7, further comprising:
    a resistor vertically between the first metal contact and the first metal line.

14. A method for operating an integrated circuit structure (IC structure), the IC structure comprising a resistive memory string over a substrate, the resistive memory string having a plurality of sub-strings connected in series, each of the sub-strings comprising a plurality of word line transistors and a pair of terminal transistors connected in series, thereby forming a pickup terminal between two of the terminal transistors in adjacent two of the sub-strings, the each of the sub-strings further comprising a plurality of resistors, each connected in parallel with a respective one of the word line transistors, the method comprising:
- alternating applying a first operation voltage and a second operation voltage on the pickup terminals of the resistive memory string;
- performing a program operation on the resistive memory string; and
- performing an erase operation on the resistive memory string.

15. The method of claim 14, wherein the first operation voltage is a programming voltage, and the second operation voltage is a ground voltage.

16. The method of claim 14, wherein the step of performing the program operation or the step of performing the erase operation comprises:
- activating the pair of terminal transistors of one of the sub-strings, the one of the sub-strings acting as a selected cell group, wherein the step of activating allows for forming a voltage difference between the pair of terminal transistors in the one of the sub-strings, facilitating a current flowing through the one of the sub-strings.

17. The method of claim 16, further comprising:
- deactivating one of the word line transistors in the one of the sub-strings, allowing for the current flowing through the resistor connected in parallel with the deactivated one of the word line transistors.

18. The method of claim 16, further comprising:
- activating one of the word line transistors in the one of the sub-strings, allowing for the current flowing through the activated one of the word line transistors but bypassing the resistor connected in parallel with the activated one of the word line transistors.

19. The method of claim 14, wherein the step of performing the program operation or the step of performing the erase operation comprises:
- activating a first one of the pair of terminal transistors in one of the sub-strings; and
- deactivating a second one of the pair of terminal transistors in the one of the sub-strings, the one of the sub-strings acting as an operation voltage inhibition region, wherein the step of activating accompanying the step of deactivating allows for a consistent voltage between the pair of terminal transistors in the one of the sub-strings, eliminating an operation disturbance in the one of the sub-strings.

20. The method of claim 19, further comprising:
- activating the word line transistors in the one of the sub-strings.

* * * * *